US012633945B2

(12) United States Patent
Yan et al.

(10) Patent No.: US 12,633,945 B2
(45) Date of Patent: May 19, 2026

(54) METHODS AND APPARATUS FOR PERFORMING DATA ENCODING OR DATA DECODING ON DIFFERENT LANES OF DATA STREAMS

(71) Applicant: Huawei Technologies Co., Ltd., Shenzhen (CN)

(72) Inventors: Zengchao Yan, Shenzhen (CN); Huixiao Ma, Shenzhen (CN); Xiaoling Yang, Shenzhen (CN); Wai Kong Raymond Leung, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 139 days.

(21) Appl. No.: 18/606,504

(22) Filed: Mar. 15, 2024

(65) Prior Publication Data

US 2024/0223215 A1 Jul. 4, 2024

Related U.S. Application Data

(63) Continuation of application No. PCT/CN2022/107599, filed on Jul. 25, 2022.

(30) Foreign Application Priority Data

Sep. 18, 2021 (CN) .......................... 202111127055.5

(51) Int. Cl.
*H03M 13/15* (2006.01)
*H03M 13/25* (2006.01)
*H04L 1/00* (2006.01)

(52) U.S. Cl.
CPC ...... *H03M 13/1515* (2013.01); *H04L 1/0057* (2013.01); *H03M 13/25* (2013.01)

(58) Field of Classification Search
CPC ............ H03M 13/1515; H03M 13/25; H03M 13/251; H04L 45/66; H04L 1/0057;
(Continued)

(56) References Cited

U.S. PATENT DOCUMENTS 8,949,699 B1 2/2015 Gustlin
10,491,370 B2 11/2019 Yang et al.
(Continued)

FOREIGN PATENT DOCUMENTS

CN 103534971 A 1/2014
CN 103797742 A 5/2014
(Continued)

OTHER PUBLICATIONS

IEEE Computer Society: "IEEE Standard for Ethernet." IEEE 3 Park Avenue New York, NY 10016-5997 USA. Jun. 14, 2018. IEEE Std 802.3•-2018 (Revision of IEEE Std 802.3-2015). total 5600 pages.
(Continued)

*Primary Examiner* — Justin R Knapp
(74) *Attorney, Agent, or Firm* — Slater Matsil, LLP

(57) ABSTRACT

An encoding method includes: obtaining m lanes of first data streams through m input lanes, where m is a positive integer; processing the m lanes of first data streams to obtain z lanes of second data streams, where z is a positive integer; separately performing encoding processing on each of the z lanes of second data streams to obtain z lanes of third data streams; and performing multiplex processing on the z lanes of third data streams to obtain n lanes of fourth data streams, where n is a positive integer.

18 Claims, 19 Drawing Sheets

(58) Field of Classification Search
CPC ..... H04L 1/0041; H04L 25/14; H04L 1/0083;
H04L 7/04
See application file for complete search history.

(56) References Cited

U.S. PATENT DOCUMENTS

| | | | | |
|---|---|---|---|---|
| 11,277,217 B2 * | 3/2022 | Gareau | ................. | H04J 3/1658 |
| 11,936,475 B2 * | 3/2024 | Lu | ......................... | H04L 1/0003 |
| 12,206,433 B2 * | 1/2025 | Yan | ................... | H03M 13/2707 |
| 2016/0087753 A1 | 3/2016 | Ran et al. | | |
| 2018/0205493 A1 | 7/2018 | Yang et al. | | |

FOREIGN PATENT DOCUMENTS

| | | | |
|---|---|---|---|
| CN | 111669250 A | 9/2020 |
| JP | 2010500796 A | 1/2010 |
| JP | 2010263555 A | 11/2010 |
| WO | 2008001419 A1 | 1/2008 |
| WO | 2020227976 A1 | 11/2020 |

OTHER PUBLICATIONS

Technical Editor:"Implementation Agreement 400ZR." OIF-400ZR-01.0. Mar. 10, 2020. total 100 pages.

* cited by examiner

Host A

Optical module a

Optical module b

Host B

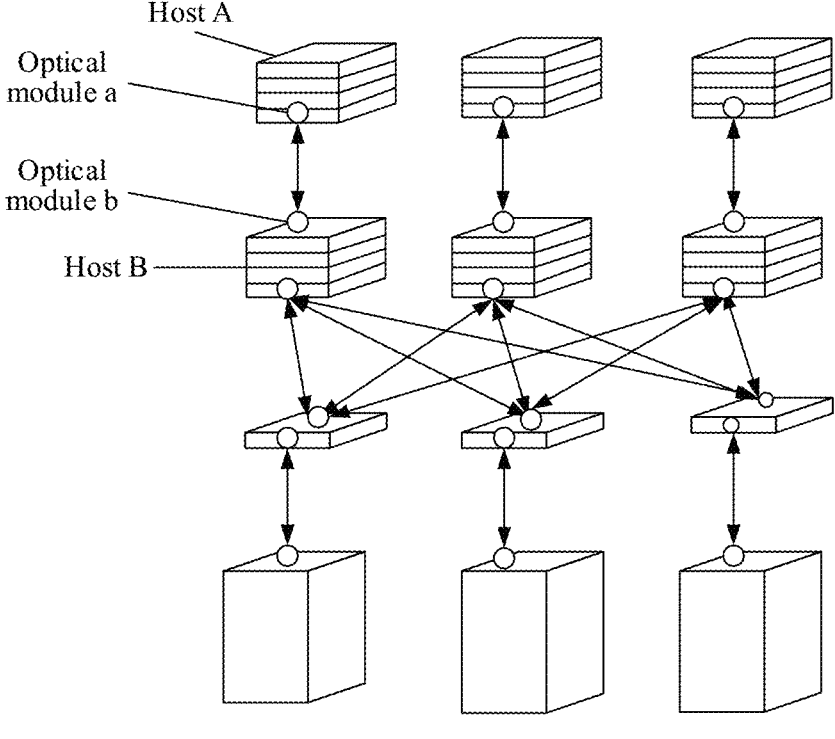

FIG. 2

301: Obtain m lanes of first data streams through m input lanes, where m is a positive integer 302: Process the m lanes of first data streams to obtain z lanes of second data streams, where z is a positive integer 303: Separately perform encoding processing on each of the z lanes of second data streams to obtain z lanes of third data streams 304: Perform multiplex processing on the z lanes of third data streams to obtain n lanes of fourth data streams, where n is a positive integer

FIG. 3

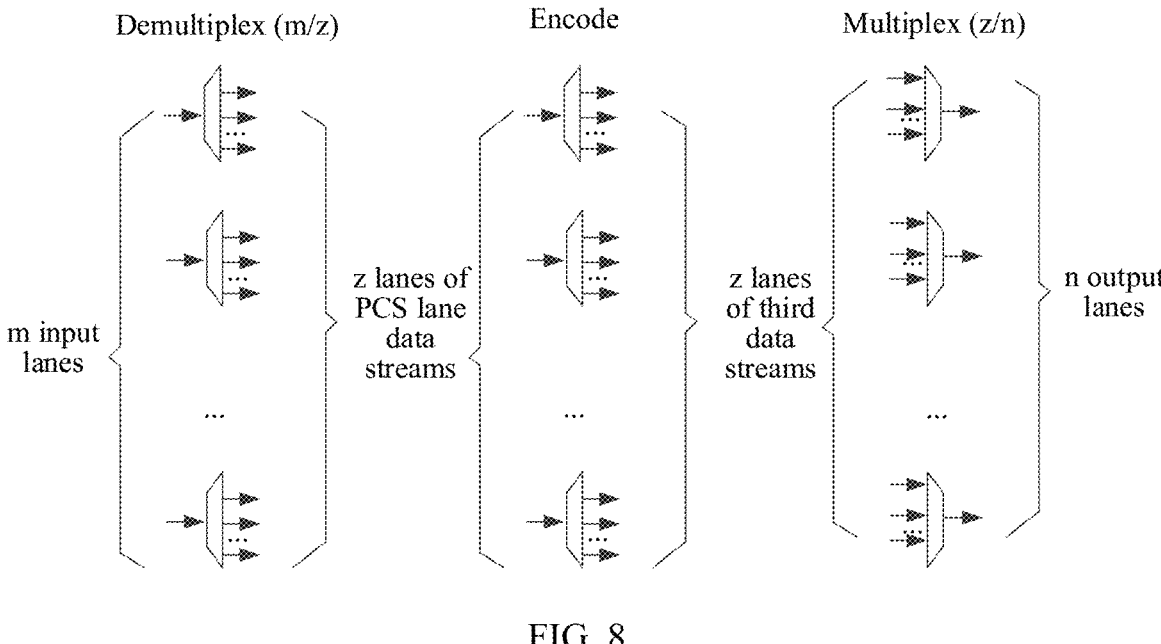

Demultiplex (m/z)          Encode          Multiplex (z/n)

m input lanes          z lanes of PCS lane data streams          z lanes of third data streams          n output lanes

FIG. 8

901: Obtain n lanes of fourth data streams through n input lanes

902: Perform demultiplex processing on the n lanes of fourth data streams to obtain z lanes of third data streams 903: Separately perform decoding processing on each of the z lanes of third data streams to obtain z lanes of second data streams 904: Perform multiplex processing on the z lanes of second data streams based on a first ratio, to obtain m lanes of first data streams

FIG. 9

METHODS AND APPARATUS FOR PERFORMING DATA ENCODING OR DATA DECODING ON DIFFERENT LANES OF DATA STREAMS

CROSS-REFERENCE TO RELATED APPLICATIONS

This application is a continuation of International Application No. PCT/CN2022/107599 filed on Jul. 25, 2022, which claims priority to Chinese Patent Application No. 202111127055.5, filed on Sep. 18, 2021. The disclosures of the aforementioned applications are hereby incorporated by reference in their entireties.

TECHNICAL FIELD

Embodiments of this application relate to the field of communication technologies, and specifically, to an encoding method, a decoding method, and a related apparatus.

BACKGROUND

Currently, application of a fifth generation mobile communication technology (5G), artificial intelligence, virtual reality, and the like is driving continuous and rapid growth of traffic of a data center. An existing 400GE technology cannot satisfy a requirement of an underlying interconnection architecture of a future data center. Therefore, a next-generation Ethernet technology with a throughput greater than 400 Gbps is needed to satisfy a bandwidth requirement of the future data center. As an Ethernet transmission rate increases, a transmission bit error rate increases. Forward error correction (FEC) becomes a key core technology to eliminate a transmission bit error. Designing an efficient, low-complexity, and low-delay FEC encoding algorithm and implementation architecture becomes a major technical challenge for the next-generation Ethernet technology.

In a related existing Ethernet communication architecture, a physical of the Ethernet communication architecture may be divided into a physical coding sublayer (PCS), a physical medium attachment sublayer (PMA), and a physical media dependent (PMD) sublayer. At the PCS layer, main data stream operations such as 64B/66B encoding processing, 256B/257B transcoding processing, alignment marker insertion processing, and Reed-Solomon (RS) encoding processing are sequentially completed on data streams. Then, data streams obtained through the RS encoding processing are distributed to physical coding sublayer lanes (PCS lanes), multiplex processing is performed by using a multiplexer (MUX), and then data streams obtained through the multiplex processing are sent to the PMA layer through m output lanes. At the PMA layer, operations such as clock and data recovery (CDR), transmitting-end bit multiplexing, and signal driving are performed on the received data streams. In addition, at the PMD layer, operations such as optical modulation and electrical-optical conversion of data are completed on data streams output from the PMA layer, and optical signals are output to a transmission medium, to complete an entire data operation at a transmitting end.

However, in the related existing Ethernet communication architecture, the data streams are transmitted to the PMA layer of an optical module through the m output lanes at the PCS layer, and delay skew occurs between physical lanes. To ensure data stream alignment, operations such as alignment, deskewing, and reordering of a plurality of physical coding sublayer lanes need to be completed, which has extremely great complexity and delay costs. In addition, the existing Ethernet communication architecture is applicable only to a scenario in which a throughput is within 400 Gbps. However, as an Ethernet transmission rate increases, the existing Ethernet communication architecture cannot satisfy a system error correction performance requirement required by next-generation Ethernet communication with the throughput greater than 400 Gbps.

SUMMARY

Embodiments of this application disclose an encoding method, a decoding method, and a related apparatus, so as to separately perform inner-code encoding processing on each of z lanes of second data streams, without performing operations such as deskewing and reordering on the z lanes of second data streams, which reduces operation complexity and a delay.

According to a first aspect, an embodiment of this application provides an encoding method. The encoding method may be applied to an optical module or another encoding apparatus. In the encoding method, m lanes of first data streams are obtained through m input lanes, where m is a positive integer. The m lanes of first data streams are processed to obtain z lanes of second data streams, where z is a positive integer. Encoding processing is separately performed on each of the z lanes of second data streams to obtain z lanes of third data streams. Multiplex processing is performed on the z lanes of third data streams to obtain n lanes of fourth data streams, where n is a positive integer. It should be noted that each lane of second data stream may include Y to-be-encoded data blocks, and the to-be-encoded data block may be understood as a to-be-encoded information bit. For the to-be-encoded data block in the lane of second data stream, a mapping relationship between the to-be-encoded data block and an RS codeword satisfies: $Y \times$ Length of the to-be-encoded data block$=X \times (N \times$Codeword length of the RS codeword$)/z$, where Y and X are positive integers greater than or equal to 1. It should be noted that, a length of each to-be-encoded data block is k, a parity bit length is p, and a total codeword length is n, where n, k, and p satisfy $n=k+p$, and n, k, and p are integers greater than 0. For example, if the length k of the to-be-encoded data block is 170 bits, the total codeword length of the to-be-encoded data block is 180 bits after 10 parity bits are added. Alternatively, if the length k of the to-be-encoded data block is 170 bits, the total codeword length of the to-be-encoded data block is 179 bits after 9 parity bits are added. Alternatively, if the length k of the to-be-encoded data block is 170 bits, the total codeword length of the to-be-encoded data block is 181 bits after 11 parity bits are added. Alternatively, if the length k of the to-be-encoded data block is 120 bits, the total codeword length of the to-be-encoded data block is 128 bits after 8 parity bits are added. These are merely used as examples for description herein, and are not specifically limited in this application.

In the foregoing manner, in this embodiment of this application, inner-code encoding processing is separately performed on each of the z lanes of second data streams, and an FEC codeword in each third data stream obtained through encoding includes a boundary identifier. This ensures that the inner-code encoding is decoupled from data obtained through encoding at an upper-layer PCS layer, ensures that the inner-code encoding is decoupled from transmission at a lower-layer PMD layer, and can reduce a delay of processing delay skew and disorder, so that inner-code encoding and decoding in this application are applicable to a scenario sensitive to a transmission delay.

In some possible implementations, each of the z lanes of second data streams includes a to-be-encoded data block. In the encoding method, encoding processing may be performed on the z lanes of second data streams in the following manner: performing inner-code encoding processing on a first data block to obtain one or more FEC codewords, where the first data block is at least C/z consecutive to-be-encoded data blocks in the corresponding second data stream, C is a positive integer, and C is an integer multiple of z. The encoding method further includes: inserting a first identifier at a position of a codeword boundary of any one of the FEC codewords, where the first identifier identifies the codeword boundary of the FEC codeword, and a throughput or a baud rate of an FEC codeword obtained through insertion of the first identifier is an integer multiple of a reference clock. It should be noted that the position of the codeword boundary may be understood as a codeword start and/or a codeword end. This is not limited herein. The codeword boundary of the FEC codeword is identified by the first identifier, so that a boundary position of each FEC codeword can be determined by directly identifying the first identifier in a subsequent decoding process, and a case in which inner-code decoding is ineffective in a case of the delay skew and an unknown data start position is avoided.

In some other possible implementations, each of the z lanes of second data streams includes a to-be-encoded data block. In the encoding method, encoding processing may alternatively be performed on the z lanes of second data streams in the following manner: inserting a first identifier into each to-be-encoded data block in a first data block to obtain a second data block, where the first data block is at least C/z consecutive to-be-encoded data blocks in the corresponding second data stream; and performing encoding processing on the second data block to obtain an FEC codeword, where a throughput or a baud rate of the FEC codeword is an integer multiple of a reference clock. In the foregoing manner, a codeword boundary of the FEC codeword obtained through encoding is identified by the first identifier, so that a boundary position of each FEC codeword can be determined by directly identifying the first identifier in a subsequent decoding process, and a case in which inner-code decoding is ineffective in a case of the delay skew and an unknown data start position is avoided.

In some other possible implementations, the first identifier is a preset identifier sequence. For example, the first identifier may be a sequence consisting of "1" and "0", a sequence such as "101010" or "1010" may be selected as the first identifier, or the first identifier may be another known sequence. This is not limited herein. In the foregoing manner, the first identifier is set to be the preset identifier sequence, so that requirements in different scenarios can be satisfied.

In some other possible implementations, the first identifier is obtained based on a value of a first bit in the first data block, where the first bit is any one of at least one bit in the first data block; or the first identifier is obtained based on bit values of at least L second bits in the first data block, where there is an interval of s bits between every two adjacent second bits in the L second bits, $L \geq 2$, $s \geq 0$, and L and s are integers. For example, the first bit may be the $0^{th}$ bit in the first data block. If a value of the $0^{th}$ bit is "0", the first identifier, that is, "1", may be obtained by directly performing a negation operation on the value of the $0^{th}$ bit. Alternatively, if a value of the $0^{th}$ bit is "1", the first identifier, that is, "0", may be obtained by directly performing a negation operation on the value of the $0^{th}$ bit. This is not specifically limited herein. During actual application, the first bit may alternatively be the $1^{st}$ bit, the $2^{nd}$ bit, or the like in the first data block. This is not limited herein. For example, a codeword length of the first data block is 180 bits. A last bit may be selected for negation. That is, a value of the $179^{th}$ bit is selected to directly perform a negation operation, to obtain the first identifier. The first identifier is obtained by performing a negation operation on a bit at a start position or an end position of a codeword. This helps a receiving end quickly determine a codeword boundary. Alternatively, when L=4, and s=2, the four second bits selected from the first data block are the $0^{th}$ bit, the 2nd bit, the $4^{th}$ bit, and the $6^{th}$ bit. In this way, bit values corresponding to the $0^{th}$ bit, the 2nd bit, the $4^{th}$ bit, and the $6^{th}$ bit are processed through an exclusive OR operation, and a processing result may be used as the first identifier. It should be noted that, in some examples, the four selected second bits may alternatively be the $1^{st}$ bit, the $3^{rd}$ bit, the $5^{th}$ bit, and the $7^{th}$ bit; or the like. This is not limited herein. During actual application, L may alternatively be 8, and s is 3; L is 6, and s is 4; or the like. In this application, neither a value of L nor a value of s is limited. In the foregoing manner, the first identifier is determined based on the bit in the first data block. This can also be applicable to different scenarios.

In some other possible implementations, the m lanes of first data streams may be processed in the following manner to obtain z lanes of second data streams: performing demultiplex processing on the m lanes of first data streams based on a second ratio, to obtain the z lanes of second data streams, where the second ratio is a ratio of m to z. For example, if a first ratio is 16:4, the second ratio should be 4:16. Herein, 4:16 is merely used as an example for description. During actual application, the second ratio may be another value. This is not limited in this application. In the foregoing manner, demultiplex processing is directly performed on the m lanes of first data streams, to provide a plurality of possible implementations of obtaining the z lanes of second data streams.

In some other possible implementations, the performing demultiplex processing on the m lanes of first data streams based on a second ratio, to obtain the z lanes of second data streams includes: performing demultiplex processing on the m lanes of first data streams based on the second ratio, to obtain z lanes of fifth data streams; and separately performing Q-stage processing on each of the z lanes of third data streams to obtain the z lanes of second data streams, where each stage of processing in the Q-stage processing includes: performing round-robin distribution processing on a data stream obtained at a previous stage, to obtain at least two lanes of data substreams; performing delay processing on a first data substream to obtain a sixth data stream; and performing multiplex processing on a second data substream and the sixth data stream to obtain an output data stream obtained through current-stage processing, where the first data substream is at least one of the at least two lanes of data substreams, the second data substream is one lane of data substream that is in the at least two lanes of data substreams and on which delay processing is not performed, Q is a positive integer, and the second data stream is a data stream obtained through the Q-stage processing. In the foregoing manner, the plurality of possible implementations of obtaining the z lanes of second data streams are provided.

In some other possible implementations, a bit length of the sixth data stream is at least (N×Codeword length of an RS codeword)/(z×i) bits, where N is a positive integer, and i is a quantity of the data substreams.

In some other possible implementations, the encoding method further includes: obtaining m lanes of seventh data streams through the m physical lanes; and performing demultiplex processing on the m lanes of seventh data streams based on a second ratio, to obtain z lanes of eighth data streams; and the processing the m lanes of first data streams to obtain z lanes of second data streams includes: performing multiplex processing on the z lanes of second data streams and the z lanes of eighth data streams to obtain z second data streams obtained through the multiplex processing. In the foregoing manner, a plurality of possible implementations of obtaining the z lanes of second data streams are provided.

In some other possible implementations, the encoding method further includes: identifying an alignment marker in each lane of second data stream, where the alignment marker identifies a symbol boundary in the corresponding second data stream; and determining the symbol boundary in the corresponding second data stream based on the alignment marker. For example, an AM alignment block of a 120-bit known sequence is added to each lane of first data stream, and there is a 48-bit common alignment marker in the AM alignment block of the 120-bit known sequence. In this case, locking and alignment may be implemented provided that the 48-bit common alignment marker is identified in an operation at a symbol boundary of the RS codeword.

In some other possible implementations, the m lanes of first data streams are obtained by performing, at a first ratio, multiplex processing on z lanes of data streams obtained through Reed-Solomon RS encoding. It should be noted that the first ratio may be understood as a ratio of z to m. For example, the first ratio is 16:4, 32:4, 32:16, or 16:8. This is not limited herein. In addition, the m lanes of first data streams include N RS codewords in total, and each lane of first data stream may include (N×Codeword length of the RS codeword)/m bits.

According to a second aspect, an embodiment of this application provides a decoding method. The decoding method may be applied to an optical module or another decoding apparatus. In the decoding method, n lanes of fourth data streams are obtained through n input lanes. Demultiplex processing is performed on the n lanes of fourth data streams to obtain z lanes of third data streams. Decoding processing is separately performed on each of the z lanes of third data streams to obtain z lanes of second data streams. Multiplex processing is performed on the z lanes of second data streams based on a first ratio, to obtain m lanes of first data streams, where the first ratio and a second ratio are reciprocal to each other.

In some other possible implementations, the z lanes of third data streams include a first identifier, and the first identifier identifies a codeword boundary of an FEC codeword. In the decoding method, the decoding method further includes: identifying the codeword boundary of the FEC codeword based on the first identifier and/or a decoding flag bit, where the decoding flag bit indicates whether the inner-code decoding processing is successful.

In some other possible implementations, before the identifying the codeword boundary of the FEC codeword based on the first identifier and/or a decoding flag bit, the decoding method further includes: generating a first signal based on the first identifier and/or the decoding flag bit, where the first signal is for determining data and clock information. It should be noted that the first signal can be for determining the data and clock information, so that a CDR unit accelerates a process of data and clock recovery, the data and clock information is determined in advance, time needed for system locking is reduced, and determining of a system transmission frequency in advance is facilitated. In addition, in terms of a design of a generation manner of a sequence corresponding to the first identifier in this application, an autocorrelation feature of the sequence corresponding to the first identifier is considered, which helps the first identifier be detected more quickly; and a fixed 0-1 transition feature of the first identifier is considered, which helps a convergence speed of the data and clock recovery of the CDR unit. It should be noted that, if the CDR unit first receives, before receiving the first signal, a signal that is fed back by the CDR unit and that is for normally recovering data and a clock, the CDR unit may enter a lock state based on the signal for normally recovering the data and the clock, to complete a data and clock recovery operation.

According to a third aspect, an embodiment of this application provides another encoding method. In the encoding method, a to-be-transmitted data stream is obtained, and RS encoding processing is performed on the to-be-transmitted data stream to obtain z lanes of data streams, where each of the z lanes of data streams corresponds to one physical coding sublayer lane. Then, multiplex processing is performed on the z lanes of data streams based on a first ratio, to obtain m lanes of first data streams, and the m lanes of first data streams are sent through m output lanes.

In some other possible implementations, the encoding method may further include: performing Q-stage processing on each of the z lanes of data streams to obtain z lanes of ninth data streams, where each stage of processing in the Q-stage processing includes: performing round-robin distribution processing on a ninth data stream obtained at a previous stage, to obtain at least two lanes of data substreams; performing delay processing on a third data substream to obtain a tenth data stream; and performing multiplex processing on a fourth data substream and the tenth data stream to obtain an ninth data stream obtained through current-stage processing, where the third data substream is at least one of the at least two lanes of data substreams, the fourth data substream is one lane of data substream that is in the at least two lanes of data substreams and on which delay processing is not performed. Then, multiplex processing is performed on the z lanes of ninth data streams based on the first ratio, to obtain the m lanes of first data streams.

According to a fourth aspect, an embodiment of this application provides an encoding apparatus. The encoding apparatus includes a first obtaining unit and a first processing unit. The first obtaining unit is configured to obtain m lanes of first data streams through m input lanes, where m is a positive integer. The first processing unit is configured to: process the m lanes of first data streams to obtain z lanes of second data streams, where z is a positive integer; separately perform encoding processing on each of the z lanes of second data streams to obtain z lanes of third data streams; and perform multiplex processing on the z lanes of third data streams to obtain n lanes of fourth data streams, where n is a positive integer.

In some other possible implementations, each of the z lanes of second data streams includes a to-be-encoded data block, and the first processing unit is configured to: perform encoding processing on a first data block to obtain one or more FEC codewords, where the first data block is at least C/z consecutive to-be-encoded data blocks in the corresponding second data stream, C is a positive integer, and C is an integer multiple of z; and insert a first identifier at a position of a codeword boundary of any one of the FEC codewords, where the first identifier identifies the codeword boundary of the FEC codeword, and a throughput or a baud rate of an FEC codeword obtained through insertion of the first identifier is an integer multiple of a reference clock. In the foregoing manner, the codeword boundary of the FEC codeword obtained through encoding is identified by the first identifier, so that a boundary position of each FEC codeword can be determined by directly identifying the first identifier in a subsequent decoding process, and a case in which inner-code decoding is ineffective in a case of delay skew and an unknown data start position is avoided.

In some other possible implementations, each of the z lanes of second data streams includes a to-be-encoded data block, and the first processing unit is configured to: insert a first identifier into each to-be-encoded data block in a first data block to obtain a second data block, where the first data block is C/z consecutive to-be-encoded data blocks, C is a positive integer, and C is an integer multiple of z; and perform encoding processing on the second data block to obtain an FEC codeword, where a throughput or a baud rate of the FEC codeword is an integer multiple of a reference clock. In the foregoing manner, a codeword boundary of the FEC codeword is identified by the first identifier, so that a boundary position of each FEC codeword can be determined by directly identifying the first identifier in a subsequent decoding process, and a case in which inner-code decoding is ineffective in a case of delay skew and an unknown data start position is avoided.

In some other possible implementations, the first identifier is a preset identifier sequence. In the foregoing manner, the first identifier is set to be the preset identifier sequence, so that requirements in different scenarios can be satisfied.

In some other possible implementations, the first identifier is obtained based on a value of a first bit in the first data block, where the first bit is any one of at least one bit in the first data block; or the first identifier is obtained based on bit values of at least L second bits in the first data block, where there is an interval of s bits between every two adjacent second bits in the L second bits, $L \geq 2$, $s \geq 0$, and L and s are integers.

In some other possible implementations, the first processing unit is configured to perform demultiplex processing on the m lanes of first data streams based on a second ratio, to obtain the z lanes of second data streams, where the second ratio is a ratio of m to z.

In some other possible implementations, the first processing unit is configured to: perform demultiplex processing on the m lanes of first data streams based on the second ratio, to obtain z lanes of fifth data streams; and separately perform Q-stage processing on each of the z lanes of fifth data streams to obtain the z lanes of second data streams, where each stage of processing in the Q-stage processing includes: performing round-robin distribution processing on a data stream obtained at a previous stage, to obtain at least two lanes of data substreams; performing delay processing on a first data substream to obtain a sixth data stream; and performing multiplex processing on a second data substream and the sixth data stream to obtain an output data stream obtained through current-stage processing, where the first data substream is at least one of the at least two lanes of data substreams, the second data substream is one lane of data substream that is in the at least two lanes of data substreams and on which delay processing is not performed, Q is a positive integer, and the second data stream is a data stream obtained through the Q-stage processing.

In some other possible implementations, a bit length of the sixth data stream is at least (N×Codeword length of an RS codeword)/(z×i) bits, where N is a positive integer, and i is a quantity of the data substreams.

In some other possible implementations, the first obtaining unit is further configured to obtain m lanes of seventh data streams through the m input lanes; and the first processing unit is configured to: perform demultiplex processing on the m lanes of seventh data streams based on a second ratio, to obtain z lanes of eighth data streams; and perform multiplex processing on the z lanes of second data streams and the z lanes of eighth data streams to obtain z second data streams obtained through the multiplex processing.

In some other possible implementations, the first processing unit is further configured to: identify an alignment marker in each lane of second data stream, where the alignment marker identifies a symbol boundary in the corresponding second data stream; and determine the symbol boundary in the corresponding second data stream based on the alignment marker.

In some other possible implementations, the m lanes of first data streams are obtained by performing, at a first ratio, multiplex processing on z lanes of data streams obtained through Reed-Solomon RS encoding.

According to a fifth aspect, an embodiment of this application provides a decoding apparatus. The decoding apparatus includes a second obtaining unit and a second processing unit. The second obtaining unit is configured to obtain n lanes of fourth data streams through n input lanes. The second processing unit is configured to: perform demultiplex processing on the n lanes of fourth data streams to obtain z lanes of third data streams; separately perform decoding processing on each of the z lanes of third data streams to obtain z lanes of second data streams; and perform multiplex processing on the z lanes of second data streams based on a first ratio, to obtain m lanes of first data streams, where the first ratio and a second ratio are reciprocal to each other.

In some other possible implementations, the z lanes of third data streams include a first identifier, and the first identifier identifies a codeword boundary of an FEC codeword; and the second processing unit is further configured to: identify the codeword boundary of the FEC codeword based on the first identifier and/or a decoding flag bit, where the decoding flag bit indicates whether the decoding processing is successful.

In some other possible implementations, the second processing unit is further configured to generate a first signal based on the first identifier and/or the decoding flag bit before identifying the codeword boundary of the FEC codeword based on the first identifier and/or the decoding flag bit, where the first signal is for determining data and clock information. It should be noted that the first signal can be for determining the data and clock information, so that a CDR unit accelerates a process of data and clock recovery, the data and clock information is determined in advance, time needed for system locking is reduced, and determining of a system transmission frequency in advance is facilitated. In addition, in terms of a design of a generation manner of a sequence corresponding to the first identifier in this application, an autocorrelation feature of the sequence corresponding to the first identifier is considered, which helps the first identifier be detected more quickly; and a fixed 0-1 transition feature of the first identifier is considered, which helps a convergence speed of the data and clock recovery of the CDR unit. It should be noted that, if the CDR unit first receives, before receiving the first signal, a signal that is fed back by the CDR unit and that is for normally recovering data and a clock, the CDR unit may enter a lock state based on the signal for normally recovering the data and the clock, to complete a data and clock recovery operation.

According to a sixth aspect, an embodiment of this application provides an encoding apparatus. The encoding apparatus may include a memory, configured to store computer-readable instructions. The encoding apparatus may further include a processor coupled to the memory and configured to execute the computer-readable instructions in the memory, to enable the encoding apparatus to perform the encoding method according to any one of the first aspect or the possible implementations of the first aspect.

According to a seventh aspect, an embodiment of this application provides a decoding apparatus. The decoding apparatus may include a memory, configured to store computer-readable instructions. The decoding apparatus may further include a processor coupled to the memory and configured to execute the computer-readable instructions in the memory, to enable the decoding apparatus to perform the method according to any one of the second aspect or the possible implementations of the second aspect.

According to an eighth aspect, an embodiment of this application provides a computer-readable storage medium, including instructions. When the instructions are run on a computer, the computer is enabled to perform the method according to any one of the first aspect, the second aspect, or the possible implementations of the first aspect or the second aspect.

According to a ninth aspect, an embodiment of this application provides a computer program product including instructions. When the computer program product runs on a computer, the computer is enabled to perform the method according to any one of the first aspect, the second aspect, or the possible implementations of the first aspect or the second aspect.

A tenth aspect of this application provides a chip system. The chip system may include a processor, configured to support an encoding apparatus in implementing a function in the encoding method according to any one of the first aspect or the possible implementations of the first aspect or support a decoding apparatus in implementing a function in the decoding method according to any one of the second aspect or the possible implementations of the second aspect.

Optionally, with reference to the tenth aspect, in a first possible implementation, the chip system may further include a memory. The memory is configured to store program instructions and data that are necessary for the encoding apparatus and the decoding apparatus. The chip system may consist of a chip, or may include the chip and another discrete device. The chip system may include an application-specific integrated circuit (ASIC), a field programmable gate array (FPGA), another programmable logic device, or the like. Further, the chip system may further include an interface circuit and the like.

It can be learned from the foregoing technical solutions that embodiments of this application have the following advantages.

In embodiments of this application, the m lanes of first data streams are obtained through the m input lanes, where m is the positive integer; and the m lanes of first data streams are processed to obtain the z lanes of second data streams, where z is the positive integer. Then, encoding processing is separately performed on each of the z lanes of second data streams to obtain the z lanes of third data streams; and multiplex processing is performed on the z lanes of third data streams to obtain the n lanes of fourth data streams, where n is the positive integer. In the foregoing manner, in embodiments of this application, encoding processing is separately performed on each of the z lanes of second data streams, and the FEC codeword in each third data stream obtained through the encoding includes the boundary identifier. This ensures that the inner-code encoding is decoupled from the data obtained through the encoding at the upper-layer PCS layer, ensures that the inner-code encoding is decoupled from the transmission at the lower-layer PMD layer, does not need to perform the operations such as the deskewing and the reordering on the second data streams, and reduces the delay of processing the delay skew and the disorder, so that the inner-code encoding and decoding in this application are applicable to the scenario sensitive to the transmission delay.

BRIEF DESCRIPTION OF THE DRAWINGS

To describe the technical solutions in embodiments of this application more clearly, the following briefly describes the accompanying drawings used in describing embodiments. Apparently, the accompanying drawings in the following descriptions show merely some embodiments of this application.

FIG. 2 is a schematic diagram of an application scenario according to an embodiment of this application;

FIG. 3 is a schematic flowchart of an encoding method according to an embodiment of this application;

FIG. 8 is a schematic diagram of overall transmission of data streams at a PMA layer;

FIG. 9 is a schematic flowchart of a decoding method according to an embodiment of this application;

11                                                              12

Figure 10A:
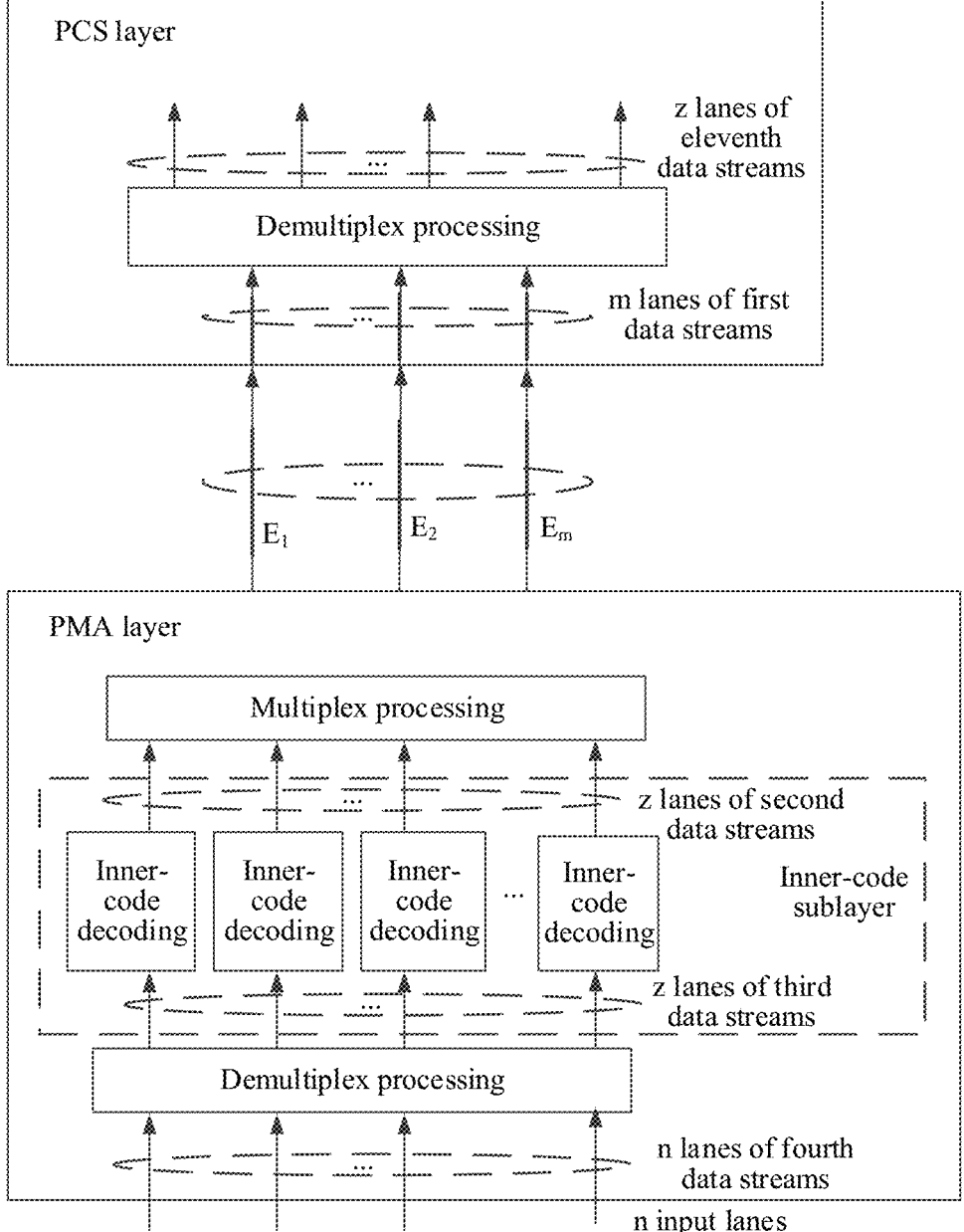
Figure 10B:
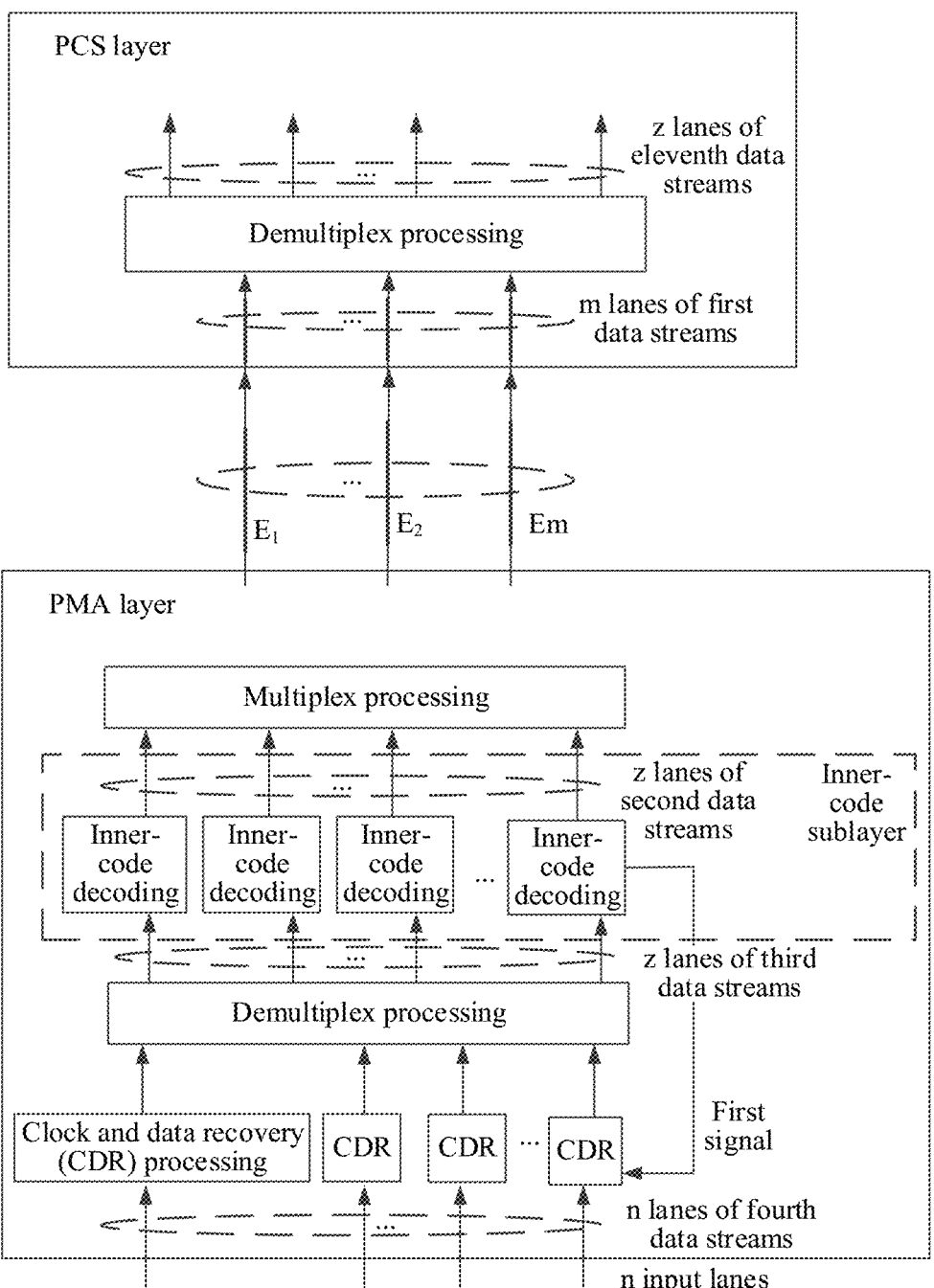
Figure 11:
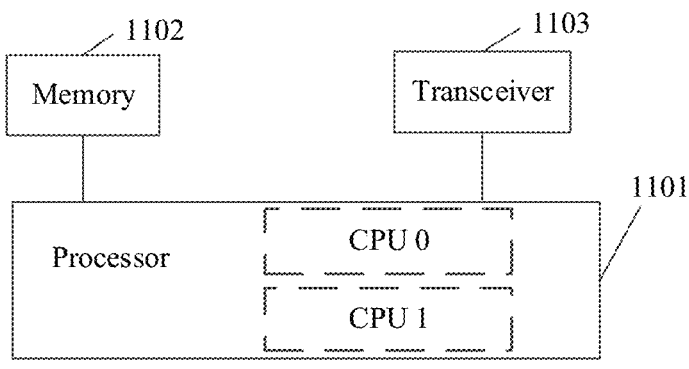
Figure 12:
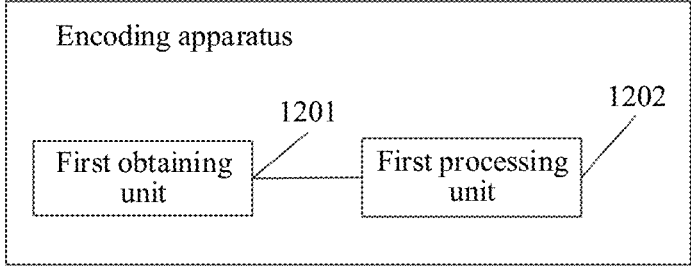
Figure 13:
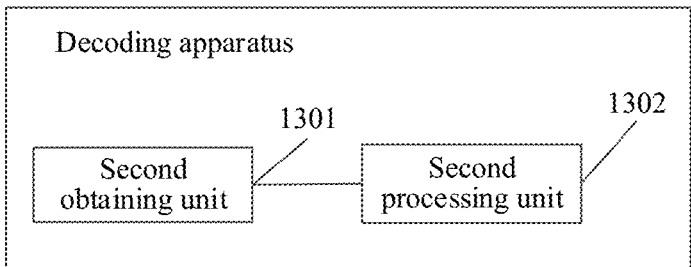

FIG. 10A is a schematic diagram of transmission of data streams in a decoding process according to an embodiment of this application;

FIG. 10B is another schematic diagram of transmission of data streams in a decoding process according to an embodiment of this application;

FIG. 11 is a schematic diagram of a hardware structure of a communication device according to an embodiment of this application;

FIG. 12 is a schematic diagram of a structure of an encoding apparatus according to an embodiment of this application; and FIG. 13 is a schematic diagram of a structure of a decoding apparatus according to an embodiment of this application.

DETAILED DESCRIPTION OF ILLUSTRATIVE EMBODIMENTS

Embodiments of this application disclose an encoding method, a decoding method, and a related apparatus, so as to separately perform encoding processing on each of z lanes of second data streams, without performing operations such as deskewing and reordering on the z lanes of second data streams, which reduces operation complexity and a delay.

The following clearly describes the technical solutions in embodiments of this application with reference to the accompanying drawings in embodiments of this application. It is clear that embodiments are some but not all of embodiments of this application. All other embodiments obtained by persons of ordinary skill in the art based on embodiments of this application without creative efforts shall fall within the protection scope of this application.

In the specification, claims, and accompanying drawings of this application, the terms "first", "second", "third", "fourth", and the like (if existent) are intended to distinguish between similar objects but do not necessarily indicate a specific order or sequence. It should be understood that the data termed in such a way are interchangeable in proper circumstances, so that embodiments of this application described herein can be implemented in an order other than those orders illustrated or described herein. In addition, the terms "include", "have", and any variant thereof are intended to cover a non-exclusive inclusion. In this application, "at least one" means one or more, and "a plurality of" means two or more. "And/or" describes an association relationship between associated objects, and represents that three relationships may exist. For example, A and/or B may represent the following cases: Only A exists, both A and B exist, and only B exists, where A and B may be singular or plural. The character "/" generally indicates an "or" relationship between the associated objects. "At least one of the following" or a similar expression thereof indicates any combination of the items, and includes a singular item or any combination of plural items. For example, at least one of a, b, or c may represent: a, b, c, a and b, a and c, b and c, or a, b, and c, where a, b, and c may be singular or plural. It should be noted that "at least one" may also be explained as "one or more".

Figure 1A:
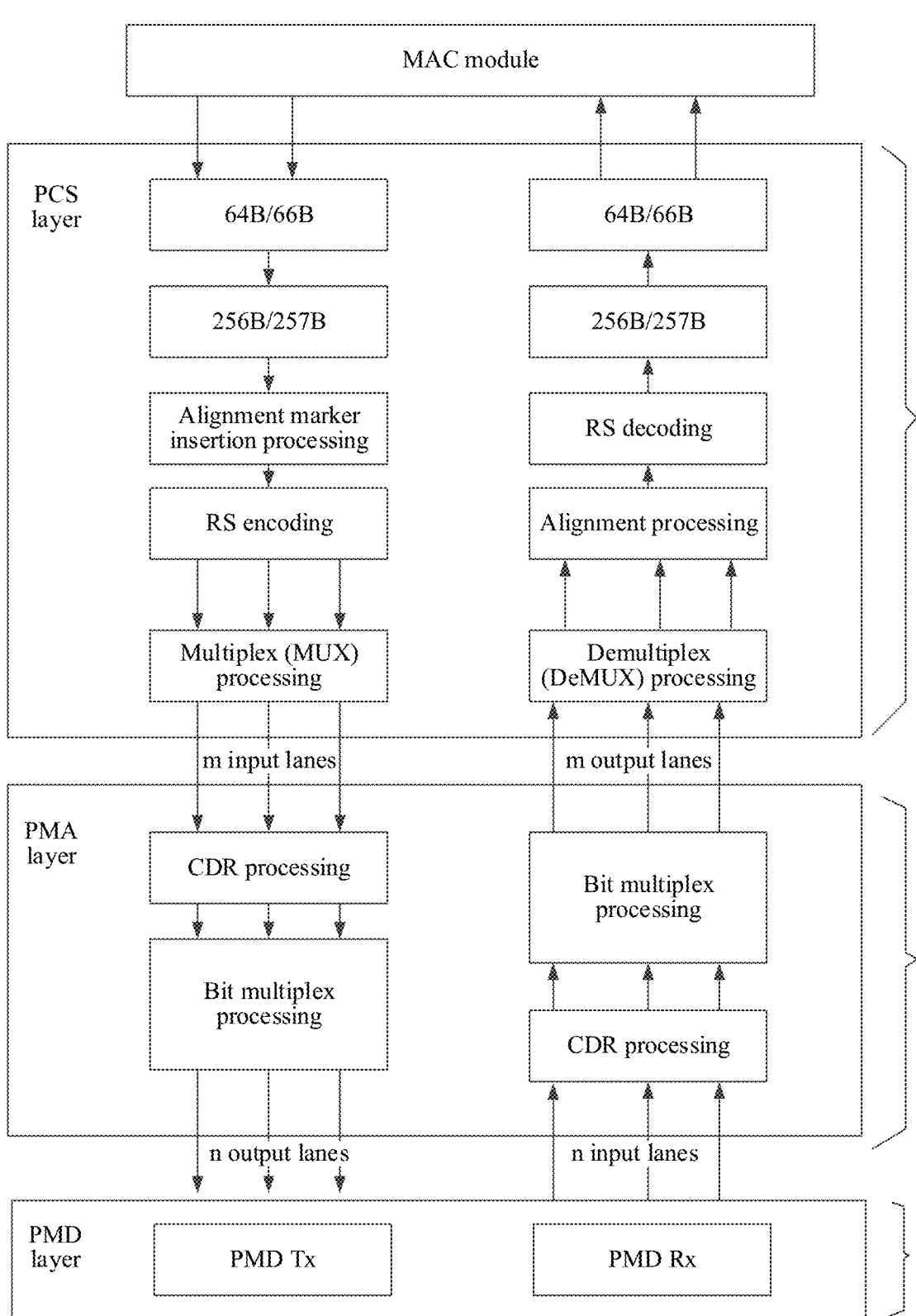
FIG. 1A is a schematic diagram of an Ethernet communication architecture according to a related solution.

In a related existing Ethernet communication architecture, a physical sublayer of the Ethernet communication architecture may be divided into a PCS layer, a PMA layer, and a PMD layer. FIG. 1A is a schematic diagram of an Ethernet communication architecture according to a related solution. As shown in FIG. 1A, data streams are obtained from a MAC module, and 64B/66B encoding processing, 256B/257B transcoding processing, alignment marker (alignment marker, AM) insertion processing, and RS encoding processing are sequentially performed on the data streams at the PCS layer. Then, after multiplex processing is performed on data streams obtained through the RS encoding processing, data streams obtained through multiplexing are transmitted to the PMA layer through m output lanes. At the PMA layer, CDR processing and bit multiplex processing are sequentially performed on the data streams received through the m input lanes, and data streams obtained through the processing are transmitted from the PMA layer to the PMD layer. Then, processing such as optical modulation is completed on the data streams at the PMD layer, and optical signals are output to a transmission medium, to complete an entire data operation at a transmitting end. A processing operation of data streams at a receiving end is a reverse operation. To be specific, processing at the PMD layer and processing at the PMA layer are sequentially completed at the receiving end. Then, the data streams are transmitted to the PCS layer through m output lanes.

However, in the related Ethernet communication architecture shown in FIG. 1A, when the data streams obtained through processing at the PCS layer are transmitted to the PMA layer through the m output lanes, delay skew occurs between the m output lanes. Consequently, the data streams obtained from the m output lanes are not synchronized in terms of time, and the data streams received at the PMA layer cannot be aligned. For details, refer to a schematic diagram of skew and disorder of data streams shown in FIG. 1B. Therefore, in the Ethernet communication architecture shown in FIG. 1A, to align the data streams between the input lanes, an encoding operation can be performed only after processing operations such as alignment, deskewing, and reordering of a plurality of physical coding sublayer lanes are completed. However, a delay needed for completing operations such as data alignment, deskewing, and reordering is 180 ns, which increases operation complexity and a delay. In addition, as an Ethernet transmission rate increases, the existing Ethernet communication architecture is applicable only to a scenario with a throughput within 400 Gbps, and cannot satisfy a system error correction performance requirement required by next-generation Ethernet communication with a throughput greater than 400 Gbps.

Figure 1B:
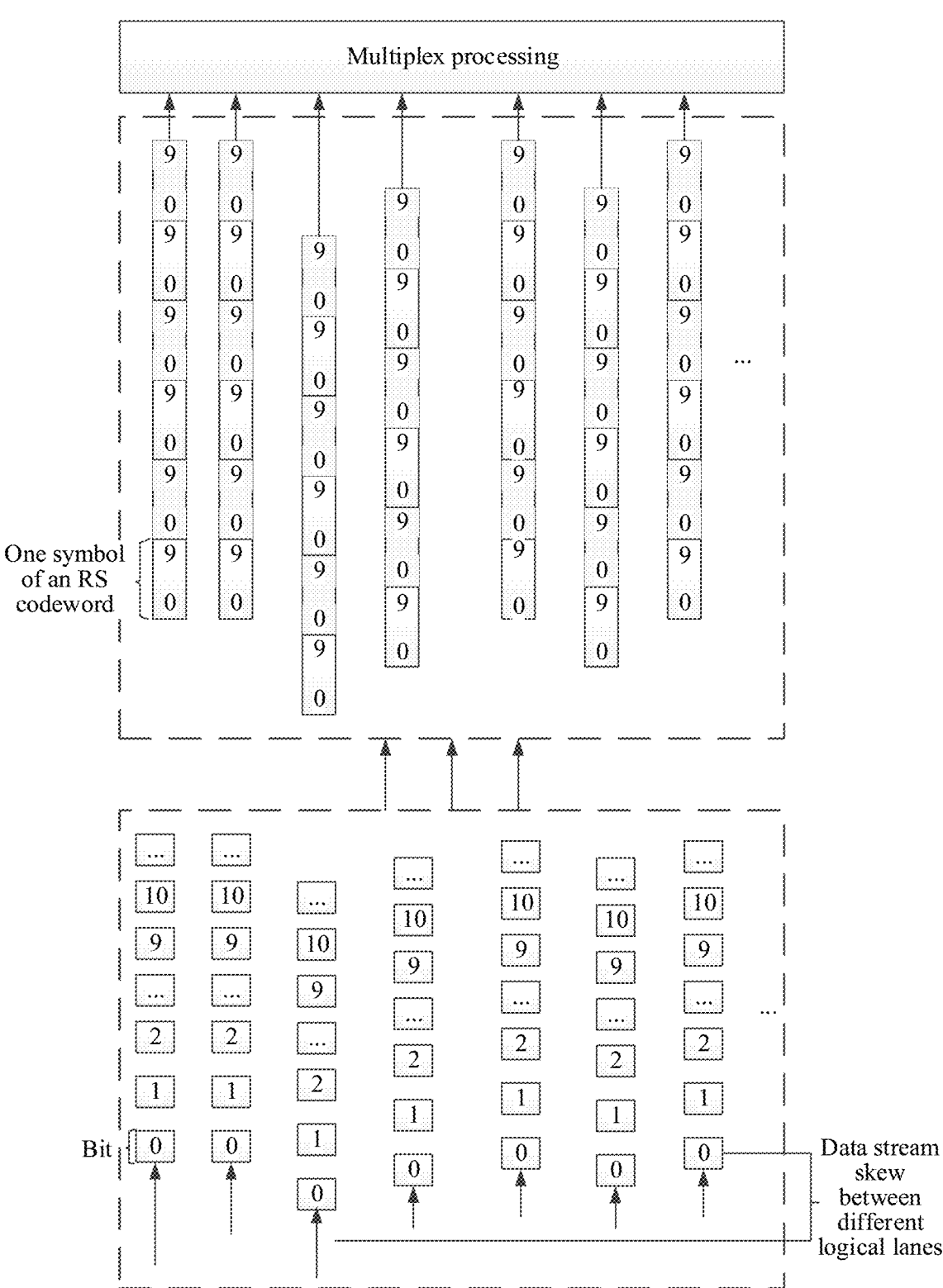
FIG. 1B is a schematic diagram of skew and disorder of data streams.

Therefore, to resolve the problems in FIG. 1A and FIG. 1B, if a one-to-one correspondence can be formed between an inner-code sublayer and a physical coding sublayer lane at the PMA layer to separately perform inner-code encoding on a data stream in each physical coding sublayer lane, the processing operations such as the deskewing and the reordering shown in FIG. 1B may be omitted, which effectively reduces the delay and the complexity. Based on this, embodiments of this application provide an encoding method and a decoding method, applied to various optical communication scenarios such as medium- and short-distance interconnection communication, long-distance interconnection communication, cloud storage, cloud computing, a 5G base station backbone network, optical transmission, optical access, and base station fronthaul of a data center. The encoding method and the decoding method may be further applied to a next-generation Ethernet communication architecture with the throughput greater than 400 Gbps (for example, an 800 Gbps throughput or a 1600 Gbps throughput). The medium- and short-distance interconnection communication includes but is not limited to an optical transmission scenario in which a distance is less than or equal to 40 km. FIG. 2 is a schematic diagram of an application scenario according to an embodiment of this application. As shown in FIG. 2, any two hosts implement data communication by using optical modules. For example, a data stream is transmitted from a host A to a host B. An optical module a is inserted into the host A, an optical module b is inserted into the host B, and the host A may send the data stream to the host B via the optical module a and the optical module b sequentially. To omit the processing operations such as the deskewing and the reordering, effectively reduce the delay and the complexity, and keep a processing procedure of the host unchanged as much as possible, a data stream processing process of the optical module needs to be changed, to process m lanes of first data streams obtained through m input lanes, recover z lanes of original second data streams, and then separately perform inner-code encoding processing on each of the z lanes of second data streams to obtain z lanes of third data streams. Inner-code encoding processing is separately performed on each lane of second data stream, without performing complex processing such as deskewing and reordering on the z lanes of second data streams. When there is a requirement for a breakout (breakout) mode in a system, it can be ensured that each lane of second data stream can be separately transmitted, provided that each input lane and each output lane at the PMA layer each are enabled to uniquely correspond to one transmission medium. The system is adapted to the breakout mode well.

It should be noted that the foregoing optical module may be understood as an optical module used when a data stream is transmitted to a receiving end, or may be understood as an optical module used when a data stream is received from a receiving end, for example, the foregoing optical module a and optical module b. During actual application, a data stream may alternatively be transmitted from the host B to the host A. This is not limited herein. In addition, the host (for example, the host A or the host B) may further include but is not limited to a switching chip or an interface chip used in a router, a switch, or an optical transport network (OTN) transmission device, or may be a mobile phone chip, a CPU chip, an interface chip that needs high-speed communication, and the like. This is not limited herein.

FIG. 3 is a schematic flowchart of an encoding method according to an embodiment of this application. As shown in FIG. 3, the encoding method may include the following steps.

301: Obtain m lanes of first data streams through m input lanes, where m is a positive integer.

In this example, after to-be-transmitted data streams sent by a MAC module are obtained at a PCS layer, 64B/66B encoding processing, 256B/257B transcoding processing, and RS encoding processing are sequentially performed on the to-be-transmitted data streams to obtain z lanes of data streams. In addition, each of the z lanes of data streams corresponds to one physical coding sublayer lane (PCS lane) at the PCS layer, so that one lane of data stream can be transmitted through one physical coding sublayer lane. Then, after the z lanes of data streams obtained through the RS encoding are obtained, multiplex processing may be performed, based on a first ratio, on the z lanes of data streams obtained through the RS encoding, to obtain the m lanes of first data streams (for example, $D_1$, $D_2$, . . . , and $D_m$). For details, refer to FIG. 1A for understanding. Details are not described herein again. It should be noted that a code in the RS encoding herein may be understood as a first code in a concatenation code, namely, a code included in the PCS layer.

In some other possible examples, at the PCS layer, before multiplex processing is performed, based on the first ratio, on the z lanes of data streams obtained through the RS encoding, to obtain the m lanes of first data streams, the following operation may be further performed first: performing Q-stage processing on each of the z lanes of data streams obtained through the RS encoding, to obtain z lanes of ninth data streams, where each stage of processing in the Q-stage processing includes: performing round-robin distribution processing on a data stream obtained at a previous stage, to obtain at least two lanes of data substreams; performing delay processing on a third data substream to obtain a tenth data stream; and performing multiplex processing on a fourth data substream and the tenth data stream to obtain an output data stream obtained through current-stage processing, where the third data substream is at least one of the at least two lanes of data substreams, the fourth data substream is one lane of data substream that is in the at least two lanes of data substreams and on which delay processing is not performed, Q is a positive integer, and the ninth data stream is a data stream obtained through the Q-stage processing. Then, multiplex processing is performed on the z lanes of ninth data streams at the PCS layer based on the first ratio, to obtain the m lanes of first data streams.

Figure 4A:
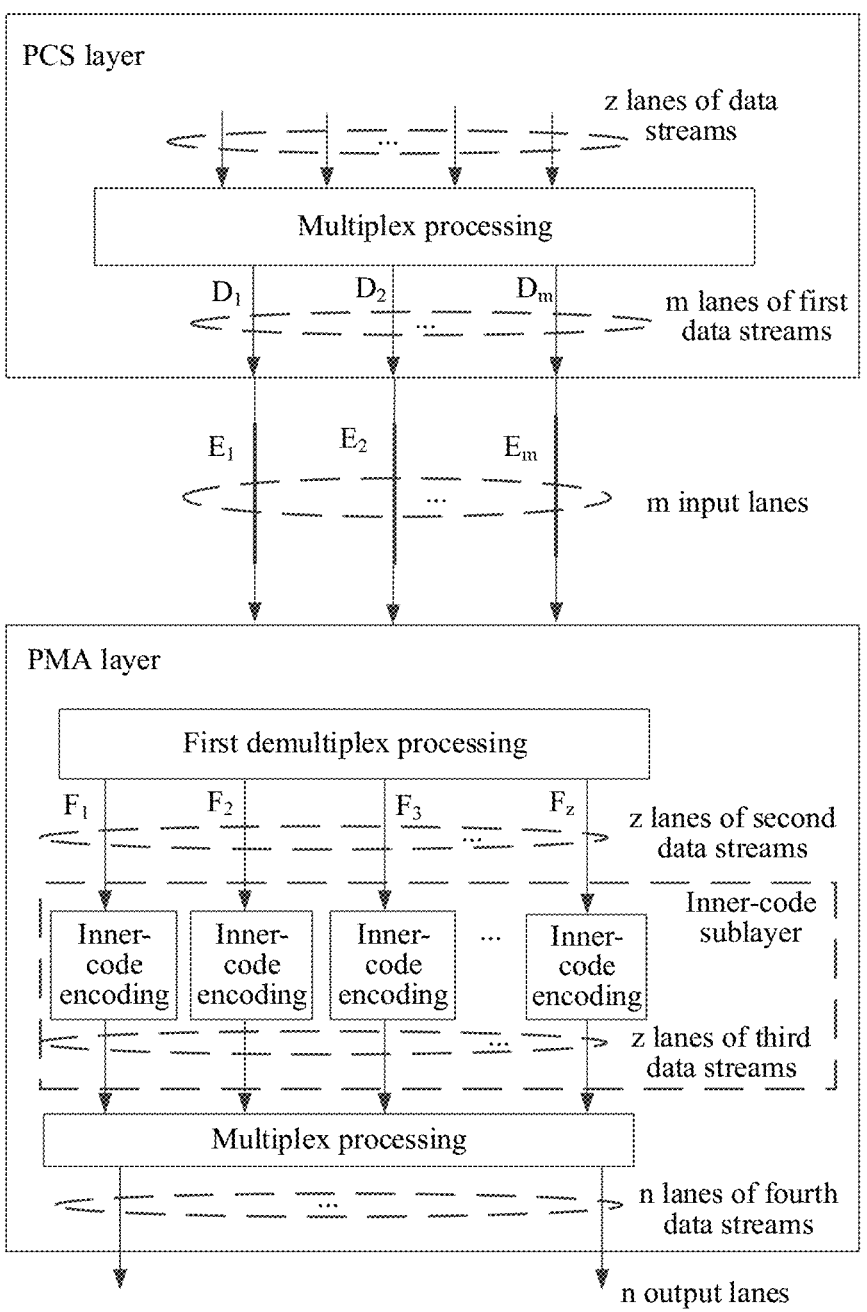
FIG. 4A is a schematic diagram of transmission of data streams in an encoding process according to an embodiment of this application.
Figure 4B:
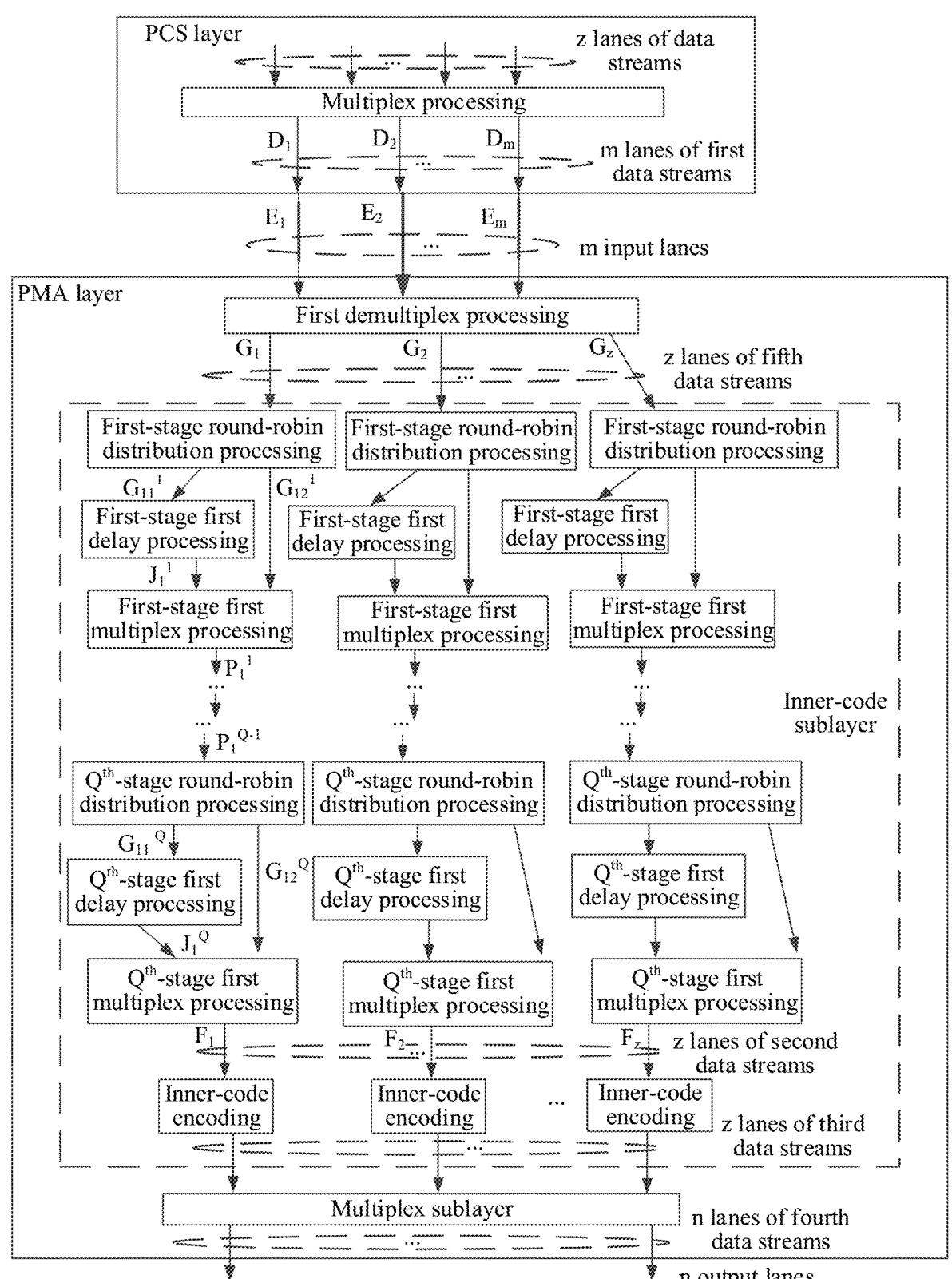
FIG. 4B is another schematic diagram of transmission of data streams in an encoding process according to an embodiment of this application.
Figure 4C:
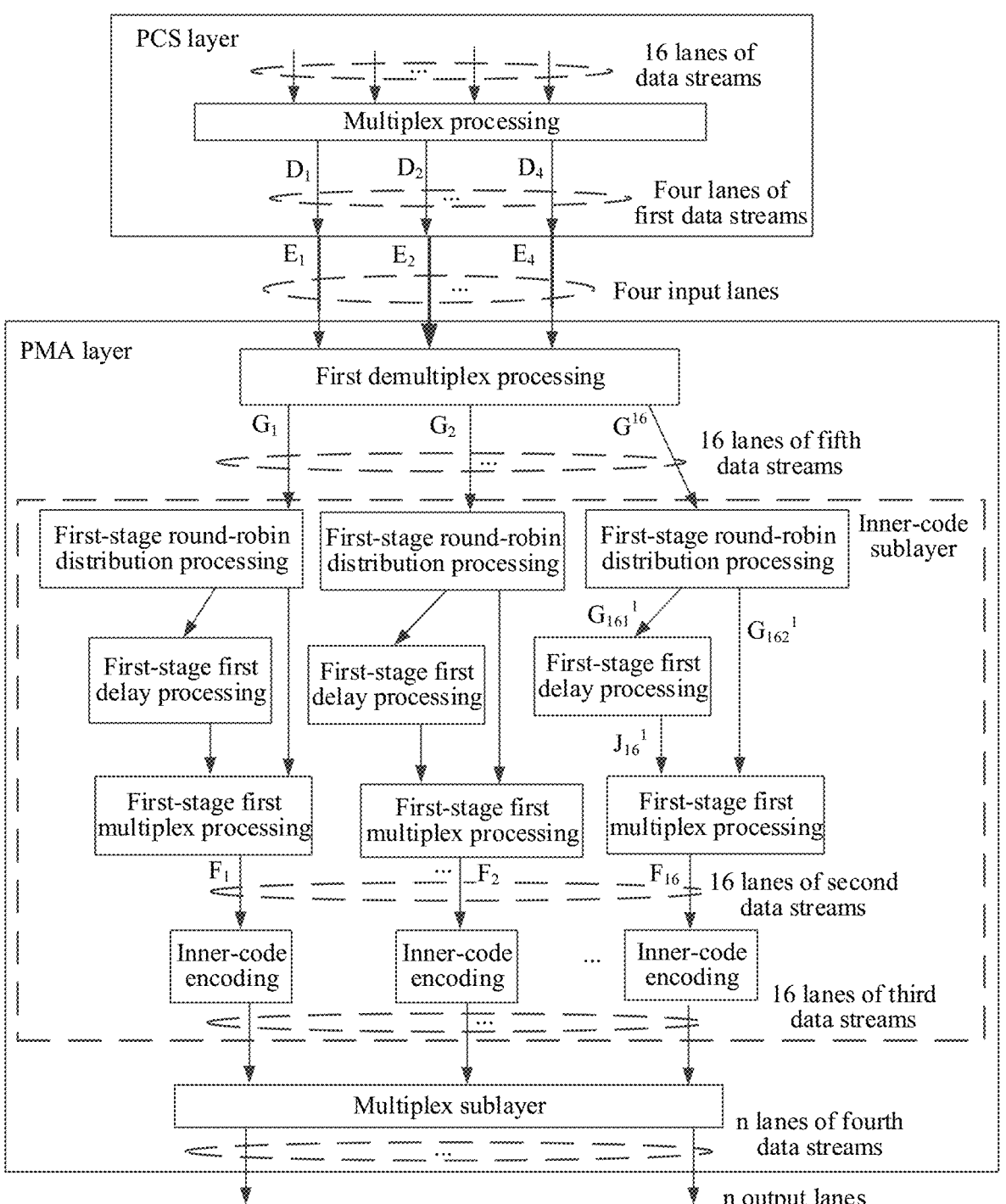
FIG. 4C is another schematic diagram of transmission of data streams in an encoding process according to an embodiment of this application.
Figure 4D:
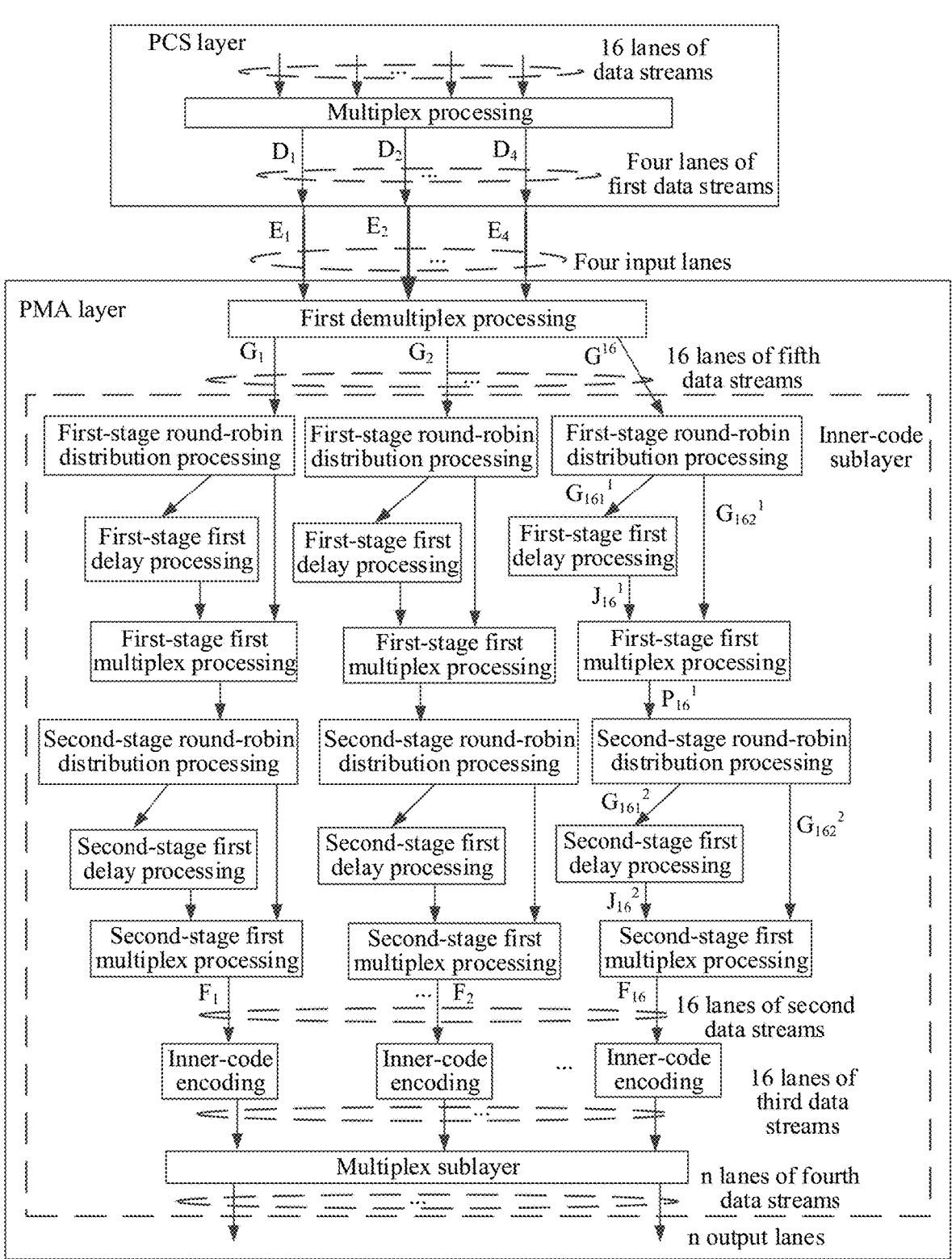
FIG. 4D is another schematic diagram of transmission of data streams in an encoding process according to an embodiment of this application.

It should be noted that, a specific process of performing Q-stage processing at the PCS layer may be understood with reference to content in subsequent FIG. 4B to FIG. 4D. Details are not described herein.

The first ratio is a ratio of z to m, or may be understood as a ratio of a quantity of physical coding sublayer lanes to a quantity of the input lanes. For example, if the PCS layer intends to send 16 lanes of data streams to a PMA layer through four output lanes, multiplex processing needs to be performed on the 16 lanes of data streams based on the first ratio 16:4, to obtain four lanes of first data streams. It should be noted that an example in which the first ratio is 16:4 is merely used for description herein. During actual application, the first ratio may alternatively be another value, for example, 32:4, 32:16, or 16:8. This is not limited herein.

In addition, the m lanes of first data streams include N RS codewords in total. For example, a value of N may be 2, 4, 6, or the like. This is not limited herein. Each lane of first data stream may include (N×Codeword length of the RS codeword)/m bits. For example, a data block length of the RS codeword may be 514 symbols, a parity bit length is 62 symbols, a total codeword length is 576 symbols, a size of each symbol is 10 bits, and an error correction capability of the codeword is 31 error symbols correctable. Alternatively, a data block length of the RS codeword may be 514 symbols, a parity bit length is 30 symbols, a total codeword length is 544 symbols, a size of each symbol is 10 bits, and an error correction capability of the codeword is 15 error symbols correctable. It should be noted that the codeword length of the RS codeword is not limited in this application. During actual application, another codeword length may be further included, to implement error correction of different error symbols.

In this way, after the m lanes of first data streams are obtained at the PCS layer, the m lanes of first data streams are transmitted from the PCS layer to the PMA layer. In this case, the PMA layer may obtain the m lanes of first data streams through the m input lanes. It should be noted that the input lane may be understood as a physical medium attachment sublayer lane, a physical lane of an AUI interface, an output lane of an upper-layer PMA layer, or the like. This is not limited in this application.

302: Process the m lanes of first data streams to obtain z lanes of second data streams, where z is a positive integer.

In this example, after the PMA layer receives, through the m input lanes (for example, $E_1$, $E_2$, . . . , and $E_m$), the m lanes of first data streams sent by the PCS layer, the m lanes of first data streams may be processed to obtain the z lanes of second data streams (for example, $F_1$, $F_2$, . . . , and $F_z$). It should be noted that a quantity of the z lanes of second data streams is equal to a quantity of the z lanes of data streams obtained by performing RS encoding on the to-be-transmitted data streams at the PCS layer in step 301. In addition, the z lanes of second data streams may also be referred to as PCS lane data streams in some possible examples.

Each lane of second data stream may include Y to-be-encoded data blocks, and the to-be-encoded data block may be understood as a to-be-encoded information bit. In addition, for the to-be-encoded data block in the lane of second data stream, a mapping relationship between the to-be-encoded data block and the RS codeword satisfies: Y×Length of the to-be-encoded data block=X×(N×Codeword length of the RS codeword)/z, where Y and X are positive integers.

In addition, a length of each to-be-encoded data block is k, a parity bit length is p, and a total codeword length is n, where n, k, and p satisfy n=k+p, and n, k, and p are integers greater than 0. For example, if the length k of the to-be-encoded data block is 170 bits, the total codeword length of the to-be-encoded data block is 180 bits after 10 parity bits are added. Alternatively, if the length k of the to-be-encoded data block is 170 bits, the total codeword length of the to-be-encoded data block is 179 bits after 9 parity bits are added. Alternatively, if the length k of the to-be-encoded data block is 170 bits, the total codeword length of the to-be-encoded data block is 181 bits after 11 parity bits are added. Alternatively, if the length k of the to-be-encoded data block is 120 bits, the total codeword length of the to-be-encoded data block is 128 bits after 8 parity bits are added. These are merely used as examples for description herein, and are not specifically limited in this application.

In some other possible examples, at the PMA layer, different processing operations may be performed on the m lanes of first data streams to obtain the z lanes of second data streams. For example, the z lanes of second data streams may be obtained by directly performing demultiplex processing on the m lanes of first data streams, may be obtained by further performing delay and multiplex processing on data streams obtained through demultiplex processing, or may be obtained by performing multiplex processing on data streams obtained through different RS encoding processing. The following separately provides detailed descriptions by using different embodiments.

(1) Directly perform demultiplex processing to obtain the z lanes of second data streams.

In some optional examples, the m lanes of first data streams may be processed in the following manner to obtain the z lanes of second data streams: performing demultiplex processing on the m lanes of first data streams based on a second ratio, to obtain the z lanes of second data streams, where the second ratio and the first ratio are reciprocal to each other.

In this example, the second ratio is a ratio of m to z, and the second ratio and the first ratio are reciprocal to each other. After the m lanes of first data streams are obtained at the PMA layer through the m input lanes, the data streams, namely, the z lanes of second data streams, with the quantity that is the same as the quantity of physical coding sublayer lanes can be obtained by directly performing demultiplexing based on the second ratio. For example, if the first ratio is 16:4, the second ratio should be 4:16. After the four lanes of first data streams are obtained through the four input lanes, 16 lanes of second data streams may be obtained through demultiplexing based on the second ratio 4:16. It should be noted that a bit length of each of the z lanes of second data streams is (N×Codeword length of the RS codeword)/z bits.

FIG. 4A is a schematic diagram of data stream transmission according to an embodiment of this application. It can be learned from FIG. 4A that, at the PMA layer, after the m lanes of first data streams are obtained through the m input lanes, first demultiplex processing is performed on the m lanes of first data streams based on the second ratio (for example, m/z), to obtain the z lanes of second data streams. It should be noted that the first demultiplex processing may include but is not limited to DeMUX. Then, inner-code encoding processing is separately performed, by using an inner-code (Inner-FEC) sublayer, on each of the z lanes of second data streams obtained through the demultiplex processing. For details, refer to content described in subsequent step 303 for understanding. Details are not described herein. Then, multiplex processing is performed on z lanes of third data streams to obtain n lanes of fourth data streams. For details, refer to content described in subsequent step 304 for understanding. Details are not described herein.

(2) Further perform delay and multiplex processing on the data streams obtained through the demultiplex processing, to obtain the z lanes of second data streams.

In some optional examples, demultiplex processing may alternatively be performed on the m lanes of first data streams at the PMA layer based on a second ratio in the following manner, to obtain the z lanes of second data streams: performing demultiplex processing on the m lanes of first data streams based on the second ratio, to obtain z lanes of fifth data streams; and then performing Q-stage processing on each of the z lanes of fifth data streams to obtain the z lanes of second data streams, where each stage of processing in the Q-stage processing includes: performing round-robin distribution processing on a data stream obtained at a previous stage, to obtain at least two lanes of data substreams; performing delay processing on a first data substream to obtain a sixth data stream; and performing multiplex processing on a second data substream and the sixth data stream to obtain an output data stream obtained through current-stage processing, where the first data substream is at least one of the at least two lanes of data substreams, the second data substream is one lane of data substream that is in the at least two lanes of data substreams and on which delay processing is not performed, Q is a positive integer, and the second data stream is a data stream obtained through the Q-stage processing.

In this example, demultiplex processing is performed on the m lanes of first data streams based on the second ratio, to obtain the z lanes of fifth data streams (for example, $G_1$, $G_2$, . . . , and $G_z$). Refer to obtaining of the z lanes of second data streams through demultiplexing in FIG. 4A for understanding. Details are not described herein again.

One (for example, $G_1$) of the lanes of fifth data streams is used as an example. At the PMA layer, first-stage round-robin distribution processing needs to be performed on a data stream obtained for a previous time, to obtain at least two lanes of data substreams, and delay processing is performed on at least one of the lanes of data substreams to obtain a first-stage sixth data stream. It should be noted that the data stream obtained at the previous time is obtained by sequentially performing round-robin distribution processing, delay processing, and multiplex processing on a previous-stage fifth data stream. A data stream that is obtained for a previous time and that is input for the first-stage round-robin distribution processing may be understood as the fifth data stream $G_1$. A data stream that is obtained for a previous time and that is input for second-stage round-robin distribution processing may be understood as an output data stream obtained through first-stage first multiplex processing. Then, multiplex processing is performed on one lane of data substream (namely, the second data substream) that is in the at least two lanes of data substreams and on which delay processing is not performed and the first-stage sixth data stream to obtain an output data stream obtained through current-stage processing. By analogy, one lane of corresponding second data stream may be obtained through $Q^{th}$-stage processing. That is, the second data stream is the data stream obtained through the Q-stage processing.

It should be noted that the foregoing Q-stage processing may be understood as Q-stage concatenation processing, or may be understood as Q-stage iteration processing. The Q-stage concatenation processing may be understood with reference to content in subsequent FIG. 4B to FIG. 4D. The Q-stage iteration processing may be understood with reference to content in subsequent FIG. 4E. The following separately provides descriptions by using different embodiments.

(1) Q-Stage Concatenation Processing

FIG. 4B is another schematic diagram of data stream transmission according to an embodiment of this application. It can be learned from FIG. 4B that, based on the structure shown in FIG. 4A, at an inner-code sublayer, first demultiplex processing is first performed on the m lanes of first data streams to obtain the z lanes of fifth data streams. Then, the z lanes of fifth data streams are processed through Q-stage round-robin distribution processing, Q-stage first delay processing, and Q-stage first multiplex processing together, to obtain the z lanes of second data streams. Specifically, after the z lanes of fifth data streams are obtained through demultiplexing, to be specific, the first demultiplex processing, the z lanes of fifth data streams may be transmitted to the first-stage round-robin distribution processing through z physical medium attachment sublayer lanes. It should be noted that the data stream that is obtained for the previous time and that is input for the first-stage round-robin distribution processing may be understood as the fifth data stream. In addition, a bit length of each stage of processing in the Q-stage concatenation processing is (N×Codeword length of the RS codeword)/z bits.

One (for example, $G_1$) of the lanes of fifth data streams is used as an example. The fifth data stream $G_1$ is input for the first-stage round-robin distribution processing, and round-robin distribution processing is performed on the fifth data stream $G_1$ through the first-stage round-robin distribution processing, to obtain at least two lanes of first-stage data substreams (for example, $G_{11}^1$, $G_{12}^1$, $G_{13}^1$, and $G_{14}^1$). $G_{11}^1$ and $G_{12}^1$ are used as an example. One (for example, $G_{11}^1$) of the lanes of first-stage data substreams is input for first-stage first delay processing, and delay processing is performed on the data substream $G_{11}^1$ through the first-stage first delay processing, to output one lane of first-stage sixth data stream (for example, $J_1^1$). Then, the first-stage sixth data stream $J_1^1$ and the other lane of first-stage data substream $G_{12}^1$ are input for the first-stage first multiplex processing, and multiplex processing is performed on the first-stage sixth data stream $J_1^1$ and the other lane of data substream $G_{12}^1$ through the first-stage first multiplex processing, to obtain one lane of first-stage output data stream (for example, $P_1^1$) obtained through the multiplex processing. It should be noted that $G_1^1$ may be understood as the foregoing first data substream, and $G_{12}^1$ may be understood as the foregoing second data substream.

Then, the first-stage output data stream $P_1^1$ is input for the second-stage round-robin distribution processing, and round-robin distribution processing is performed on the first-stage output data stream $P_1^1$ through the second-stage round-robin distribution processing, to obtain at least two lanes of second-stage data substreams (for example, $G_{11}^2$, $G_{12}^2$, $G_{13}^2$, and $G_{14}^2$). $G_{11}^2$ and $G_{12}^2$ are used as an example. One (for example, $G_{11}^2$) of the lanes of data substreams is input for second-stage first delay processing, and delay processing is performed on the data substream $G_{11}^2$ through the second-stage first delay processing, to obtain one lane of second-stage sixth data stream (for example, $J_1^2$). In this case, the lane of second-stage sixth data stream $J_1^2$ and the other lane of second-stage data substream $G_{12}^2$ are input for second-stage second multiplex processing, and one lane of second-stage output data stream (for example, $P_1^2$) may be obtained through multiplex processing, to be specific, the second-stage second multiplex processing.

The rest may be deduced by analogy, until $Q^{th}$-stage round-robin distribution processing is performed on one lane of $(Q-1)^{th}$-stage output data stream (for example, $P_1^{Q-1}$) to obtain at least two lanes of $Q^{th}$-stage data substreams (for example, $G_{11}^Q$, $G_{12}^Q$, $G_{13}^Q$ and $G_{14}^Q$). $G_{11}^Q$ and $G_{12}^Q$ are used as an example. One (for example, $G_{11}^Q$) of the lanes of $Q^{th}$-stage data substreams is input for $Q^{th}$-stage first delay processing, and delay processing is performed on the $Q^{th}$-stage data substream $G_{11}^Q$ through the $Q^{th}$-stage first delay processing, to output one lane of $Q^{th}$-stage sixth data stream (for example, $J_1^Q$). Then, the $Q^{th}$-stage sixth data stream $J_1^Q$ and the other lane of $Q^{th}$-stage data substream $G_{12}^Q$ are input for $Q^{th}$-stage first multiplex processing, and multiplex processing is performed on the $Q^{th}$-stage sixth data stream $J_1^Q$ and the other lane of $Q^{th}$-stage data substream $G_{12}^Q$ through the $Q^{th}$-stage first multiplex processing, to obtain one lane of data stream, namely, the second data stream (for example, $F_1$), finally input for encoding processing.

Similarly, for the other lanes of fifth data streams (for example, $G_2$, . . . , and $G_z$), processing may also be performed through Q-stage first delay processing and Q-stage first multiplex processing that correspond to each of the other lanes of fifth data streams, to obtain corresponding second data streams. A specific processing process may be understood with reference to the foregoing processing process of the fifth data stream $G_1$. Details are not described herein again.

Then, at the inner-code sublayer, inner-code encoding processing is separately performed on the z lanes of obtained second data streams to obtain z lanes of corresponding third data streams. For details, refer to content described in subsequent step 303 for understanding. Details are not described herein. Then, multiplex processing is performed on the z lanes of third data streams to obtain n lanes of fourth data streams. For details, refer to content described in subsequent step 304 for understanding. Details are not described herein.

It should be noted that, in a process of performing any stage of round-robin distribution processing, U bits may be used as a granularity, and round-robin distribution processing is performed, based on the granularity, on a data stream input for the stage of round-robin distribution processing. U=w×N×(Bit length of one symbol in the RS codeword), where w is a positive integer greater than or equal to 1. The foregoing first-stage round-robin distribution processing is used as an example for description. If one lane of fifth data stream (for example, $G_1$) includes four RS codewords, there are 136 symbols in total, and a bit length of each symbol is 10 bits, Granularity U=80 bits when w=2. Lengths of the data substreams $G_{11}^1$ and $G_{12}^1$ obtained through the round-robin distribution processing each are 680 bits.

It should be noted that each stage of first multiplex processing in the foregoing Q-stage first multiplex processing may include but is not limited to a symbol multiplex (symbol MUX) unit, a bit multiplex (bit MUX) unit, or the like. Each stage of first delay unit in the Q-stage first delay processing may alternatively be understood as a buffer (buffer) unit.

For example, FIG. 4C is another schematic diagram of data stream transmission according to an embodiment of this application. As shown in FIG. 4C, Q=1 and z=16 are used as an example. After first demultiplex processing is performed on the four lanes of first data streams, 16 lanes of fifth data streams (for example, $G_1$, $G_2$, . . . , and $G_{16}$) are obtained. The fifth data stream $G_{16}$ is used as an example. At the inner-code sublayer, the fifth data stream $G_{16}$ is input for the first-stage round-robin distribution processing, and round-robin distribution processing is performed on the fifth data stream $G_{16}$ through the first-stage round-robin distribution processing, to obtain at least two lanes of first-stage data substreams (for example, $G_{161}^1$, $G_{162}^1$, $G_{163}^1$, and $G_{164}^1$). $G_{161}^1$ and $G_{162}^2$ are used as an example. One (for example, $G_{161}^1$) of the lanes of first-stage data substreams is input for the first-stage first delay processing, and delay processing is performed on the data substream $G_{161}^1$ through the first-stage first delay processing, to output one lane of first-stage sixth data stream (for example, $J_{16}^1$). Then, the first-stage sixth data stream $J_{16}^1$ and the other lane of first-stage data substream $G_{162}^1$ are input for the first-stage first multiplex processing, and multiplex processing is performed on the first-stage sixth data stream $J_{161}^1$ and the other lane of data substream $G_{162}^1$ through the first-stage first multiplex processing, to obtain one lane of data stream, namely, a second data stream $F_{16}$, finally input for the encoding processing and obtained through the multiplex processing. Then, inner-code encoding processing is performed on the lane of second data stream $F_{16}$ obtained through the multiplex processing. For details, refer to content described in subsequent step 303 for understanding. Details are not described herein. It should be noted that a processing process of another fifth data stream, such as $G_1$, . . . , or $G_{15}$ may also be understood with reference to the processing process of $G_{16}$. Details are not described herein again.

Alternatively, FIG. 4D is another schematic diagram of data stream transmission according to an embodiment of this application. As shown in FIG. 4D, Q=2 and z=16 are used as an example. After first demultiplex processing is performed on the four lanes of first data streams, 16 lanes of fifth data streams (for example, $G_1$, $G_2$, . . . , and $G_{16}$) are obtained. The fifth data stream $G_{16}$ is used as an example. The fifth data stream $G_{16}$ is input for the first-stage round-robin distribution processing, and round-robin distribution processing is performed on the fifth data stream $G_{16}$ through the first-stage round-robin distribution processing, to obtain at least two lanes of first-stage data substreams (for example, $G_{161}^1$, $G_{162}^1$, $G_{163}^1$, and $G_{164}^1$). $G_{161}^1$ and $G_{162}^1$ are used as an example. One (for example, $G_{161}^1$) of the lanes of first-stage data substreams is input for the first-stage first delay processing, and delay processing is performed on the data substream $G_{161}^1$ through the first-stage first delay processing, to output one lane of first-stage sixth data stream (for example, $J_{16}^1$). Then, the first-stage sixth data stream $J_{16}^1$ and the other lane of first-stage data substream $G_{162}^1$ are input for the first-stage first multiplex processing, and multiplex processing is performed on the first-stage sixth data stream $J_{16}^1$ and the other lane of data substream $G_{162}^1$ through the first-stage first multiplex processing, to obtain one lane of first-stage output data stream (for example, $P_{16}^1$) obtained through the multiplex processing. Further, the first-stage output data stream $P_{16}^1$ is input for the second-stage round-robin distribution processing, and round-robin distribution processing is performed on the first-stage output data stream $P_{16}^1$ through the second-stage round-robin distribution processing, to obtain at least two lanes of second-stage data substreams (for example, $G_{161}^2$, $G_{162}^2$, $G_{163}^2$, and $G_{164}^2$). $G_{161}^2$ and $G_{162}^2$ are used as an example. One (for example, $G_{161}^2$) of the lanes of data substreams is input for the first-stage first delay processing, and delay processing is performed on the data substream $G_{161}^2$ through the first-stage first delay processing, to obtain one lane of second-stage sixth data stream (for example, $J_{16}^2$). In this case, the lane of second-stage sixth data stream $J_{16}^2$ and the other lane of second-stage data substream $G_{162}^2$ are input for the second-stage second multiplex processing, and finally one lane of data stream, namely, a second data stream, for example, $F_{16}$, finally input for encoding processing is output from the second-stage second multiplex processing. It should be noted that, then, inner-code encoding processing is performed on the z lanes of second data streams obtained through the multiplex processing. For details, refer to content described in subsequent step 303 for understanding. Details are not described herein.

For example, a bit quantity of the foregoing sixth data stream is at least (N×Codeword length of the RS codeword)/ (z×i) bits, where N is a positive integer, and i is a quantity of the data substreams. For example, one-stage processing shown in FIG. 4C is used as an example. For example, when Q=1, if a quantity of the data substreams obtained through the first-stage round-robin distribution processing is 4, a bit length of each lane of data substream in the first-stage data substreams (for example, $G_{161}^1$, $G_{162}^1$, $G_{163}^1$, and $G_{164}^1$) is (N×Codeword length of the RS codeword)/(z×4). In this case, a bit length of the first-stage sixth data stream $J_{16}^1$ is at least (N×Codeword length of the RS codeword)/(z×4) bits.

It should be understood that descriptions are provided by using the one-stage processing as an example in FIG. 4C, and descriptions are provided by using two-stage processing as an example in FIG. 4D. During actual application, a value of Q only needs to be an integer greater than or equal to 1. A specific value may be determined based on a requirement, and is not limited herein.

(2) Q-Stage Iteration Processing

Figure 4E:
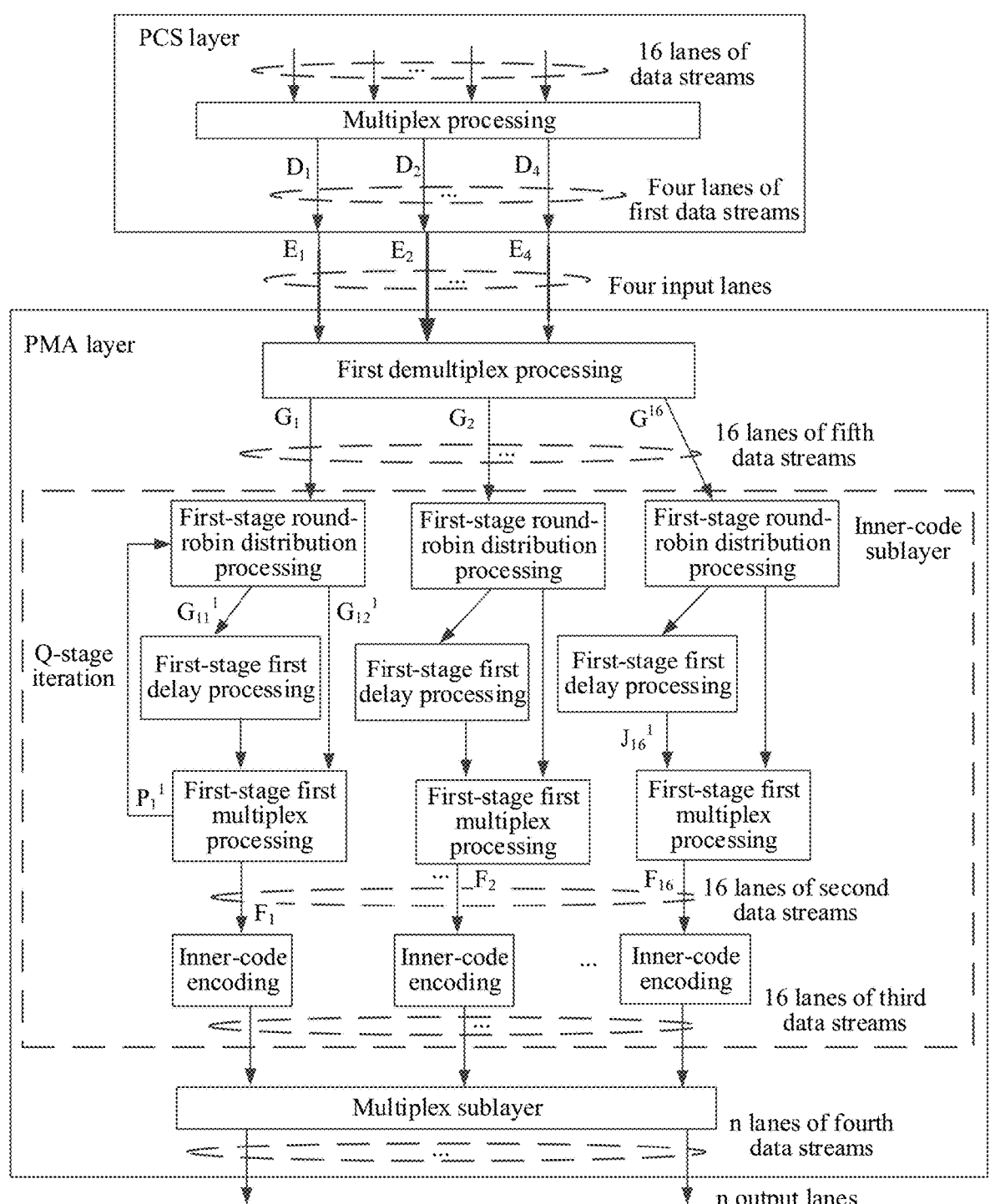
FIG. 4E is another schematic diagram of transmission of data streams in an encoding process according to an embodiment of this application.

FIG. 4E is another schematic diagram of data stream transmission according to an embodiment of this application. It can be learned from FIG. 4E that, based on the structure shown in FIG. 4A, at an inner-code sublayer, first demultiplex processing is first performed on the m lanes of first data streams to obtain the z lanes of fifth data streams. Then, Q-stage iteration processing is separately performed on the z lanes of fifth data streams to obtain the z lanes of second data streams.

Specifically, after the z lanes of fifth data streams are obtained through demultiplexing, to be specific, the first demultiplex processing, the z lanes of fifth data streams may be transmitted to the first-stage round-robin distribution processing through z physical medium attachment sublayer lanes. It should be noted that the data stream that is obtained for the previous time and that is input for the first-stage round-robin distribution processing may be understood as the fifth data stream. In addition, a bit length of each stage of processing in the Q-stage iteration processing is (N×Codeword length of the RS codeword)/z bits.

One (for example, $G_1$) of the lanes of fifth data streams is used as an example. The fifth data stream $G_1$ is input for the first-stage round-robin distribution processing, and round-robin distribution processing is performed on the fifth data stream G through the first-stage round-robin distribution processing, to obtain at least two lanes of first-stage data substreams (for example, $G_{11}^1$ and $G_{12}^1$). $G_{11}^1$ and $G_{12}^1$ are used as an example. One (for example, $G_{11}^1$) of the lanes of first-stage data substreams is input for first-stage first delay processing, and delay processing is performed on the data substream $G_1^1$ through the first-stage first delay processing, to output one lane of first-stage sixth data stream (for example, $J_1^1$). Then, the first-stage sixth data stream $J_1^1$ and the other lane of first-stage data substream $G_{12}^1$ are input for the first-stage first multiplex processing, and multiplex processing is performed on the first-stage sixth data stream $J_1^1$ and the other lane of data substream $G_{12}^1$ through the first-stage first multiplex processing, to obtain one lane of first-stage output data stream (for example, $P_1^1$) obtained through the multiplex processing. It should be noted that $G_{11}^1$ may be understood as the foregoing first data substream, and $G_{12}^1$ may be understood as the foregoing second data substream.

Then, the first-stage output data stream Pit continues to be input for the first-stage round-robin distribution processing, and round-robin distribution processing continues to be performed on the first-stage output data stream $P_1^1$ through the first-stage round-robin distribution processing, to obtain at least two lanes of second-stage data substreams (for example, $G_{11}^2$ and $G_{12}^2$). $G_{11}^2$ and $G_{12}^2$ are used as an example. One (for example, $G_{11}^2$) of the lanes of data substreams continues to be input for the first-stage first delay processing, and delay processing is performed on the data substream $G_{11}^2$ through the first-stage first delay processing, to obtain one lane of second-stage sixth data stream (for example, $J_1^2$). In this case, the lane of second-stage sixth data stream $J_1^2$ and the other lane of second-stage data substream $G_{12}^2$ continue to be input for first-stage second multiplex processing, and one lane of second-stage output data stream (for example, $P_1^2$) may be obtained through multiplex processing, to be specific, the first-stage second multiplex processing.

The rest may be deduced by analogy, until $Q^{th}$-stage round-robin distribution processing is performed on one lane of $(Q–1)^{th}$-stage output data stream (for example, $P_1^{Q-1}$) to obtain at least two lanes of $Q^{th}$-stage data substreams (for example, $G_{11}^Q$ and $G_{12}^Q$). GR and $G_{12}^Q$ are used as an example. One (for example, $G_{11}^Q$) of the lanes of $Q^{th}$-stage data substreams continues to be input for the first-stage first delay processing, and delay processing is performed on the $Q^{th}$-stage data substream $G_{11}^Q$ through the first-stage first delay processing, to output one lane of $Q^{th}$-stage sixth data stream (for example, $J_1^Q$). Then, the $Q^{th}$-stage sixth data stream $J_1^Q$ and the other lane of $Q^{th}$-stage data substream $G_{12}^Q$ are input for the first-stage first multiplex processing, and multiplex processing is performed on the $Q^{th}$-stage sixth data stream $J_1^Q$ and the other lane of $Q^{th}$-stage data substream $G_{12}^Q$ through the first-stage first multiplex processing, to obtain one lane of second data stream (for example, $F_1$).

Similarly, for the other lanes of fifth data streams (for example, $G_2, \ldots$, and $G_z$), Q-stage iteration processing that corresponds to each of the other lanes of fifth data streams may also be performed to obtain corresponding second data streams. A specific processing process may be understood with reference to the foregoing processing process of the fifth data stream $G_1$. Details are not described herein again.

Then, at the inner-code sublayer, inner-code encoding processing is separately performed on the z lanes of obtained second data streams to obtain z lanes of corresponding third data streams. For details, refer to content described in subsequent step 303 for understanding. Details are not described herein. Then, multiplex processing is performed on the z lanes of third data streams to obtain n lanes of fourth data streams. For details, refer to content described in subsequent step 304 for understanding. Details are not described herein.

It should be noted that, for a bit length of the sixth data stream obtained through the Q-stage iteration processing may alternatively be understood with reference to the bit length of the sixth data stream obtained through the Q-stage concatenation processing. Details are not described herein again.

(3) Perform multiplex processing on the data streams obtained through the different RS encoding processing, to obtain the z lanes of second data streams.

In some optional examples, the encoding method may further include: obtaining m lanes of seventh data streams through m first input lanes; and performing demultiplex processing on the m lanes of seventh data streams based on a second ratio, to obtain z lanes of eighth data streams; and the processing the m lanes of first data streams to obtain z lanes of second data streams includes: performing multiplex processing on z lanes of second data streams and the z lanes of eighth data streams to obtain the z lanes of second data streams obtained through the multiplex processing.

In this example, the m lanes of seventh data streams are obtained by performing, at the first ratio, multiplex processing on the z lanes of data streams obtained through the RS encoding. For details, refer to the m lanes of first data streams in step 301 for understanding. Details are not described herein again. At the PCS layer, the data streams obtained from the MAC module are divided into two parts of data streams with a same quantity. For each part, namely, z lanes of data streams, processing such as 64B/66B encoding processing, 256B/257B transcoding processing, alignment marker AM insertion processing, and RS encoding are sequentially completed on the z lanes of data streams at the PCS layer. Then, multiplex processing is separately performed on the two parts based on the first ratio, to obtain the m lanes of first data streams and the m lanes of seventh data streams, where each part is z lanes of data streams obtained through the RS encoding processing. Then, the PCS layer transmits the m lanes of first data streams to the PMA layer through the m output lanes, and transmits the m lanes of seventh data streams to the PMA layer through m first output lanes. In this way, after receiving, through the m input lanes, the m lanes of first data streams sent by the PCS layer, the PMA layer performs demultiplex processing on the m lanes of first data streams based on the second ratio, to obtain the z lanes of second data streams. For details, refer to FIG. 4A for understanding. Details are not described herein again. In addition, after receiving the m lanes of seventh data streams through m first input lanes, the PMA layer also performs demultiplex processing on the m lanes of seventh data streams based on the second ratio, to obtain z lanes of eighth data streams. For details, refer to FIG. 4A for understanding. Details are not described herein again. Then, the PMA layer may perform multiplex processing on the z lanes of second data streams and the z lanes of eighth data streams to obtain the z lanes of second data streams obtained through the multiplex processing.

Figure 4F:
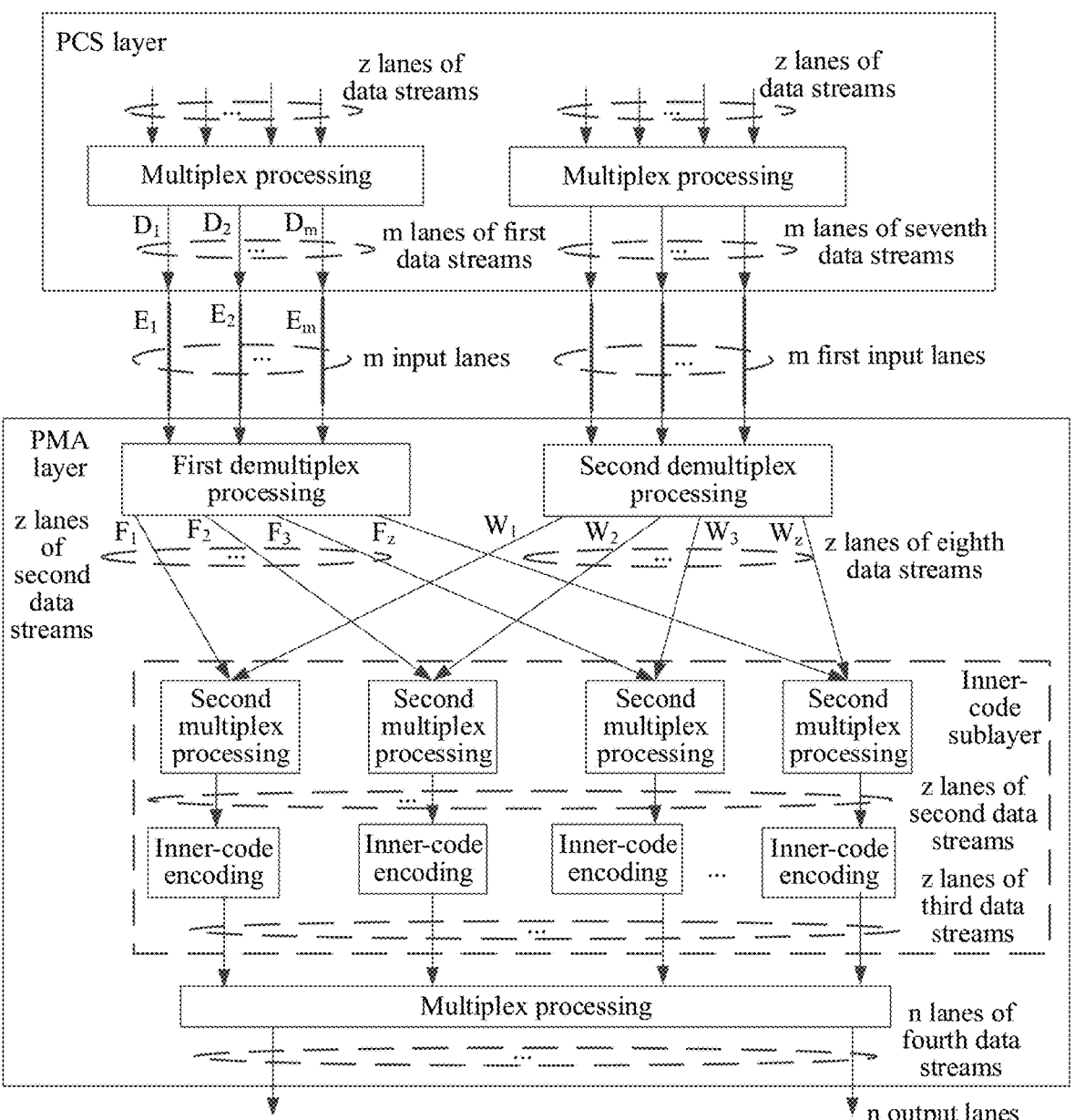
FIG. 4F is another schematic diagram of transmission of data streams in an encoding process according to an embodiment of this application.

For example, FIG. 4F is another schematic diagram of data stream transmission according to an embodiment of this application. It can be learned from FIG. 4F that, based on the structure shown in FIG. 4A, at the PMA layer, second demultiplex processing is first performed on the m lanes of seventh data streams based on the second ratio, to obtain the z lanes of eighth data streams. Then, at an inner-code sublayer of the PMA layer, second multiplex processing is performed on the z lanes of second data streams and the z lanes of eighth data streams to obtain the z lanes of second data streams obtained through the multiplex processing. For example, z=16. The 16 lanes of second data streams are represented as $F_1$, $F_2$, . . . , and $F_{16}$, and the 16 lanes of eighth data streams are represented as $W_1$, $W_2$, . . . , and $W_{16}$. Second multiplex processing may be performed on the second data stream $F_1$ and the eighth data stream $W_1$ to obtain one lane of second data stream obtained through the processing. Similarly, second multiplex processing may also be performed on the second data stream $F_2$ and the eighth data stream $W_2$ to obtain another lane of second data stream obtained through the processing. By analogy, 16 lanes of second data streams obtained through the multiplex processing may be obtained. Then, inner-code encoding processing is performed on the z lanes of second data streams obtained through the multiplex processing. For details, refer to content described in subsequent step 303 for understanding. Details are not described herein.

In some possible examples, after the performing multiplex processing on z lanes of second data streams and the z lanes of eighth data streams to obtain the z lanes of second data streams obtained through the multiplex processing, the encoding method may further include: separately performing Q-stage processing on each of the z lanes of second data streams obtained through the multiplex processing, to obtain z lanes of twelfth data streams, where each stage of processing in the Q-stage processing includes: performing round-robin distribution processing on a data stream obtained at a previous stage, to obtain at least two lanes of data substreams; performing delay processing on a fifth data substream to obtain a thirteenth data stream; and performing multiplex processing on a sixth data substream and the thirteenth data stream to obtain an output data stream obtained through current-stage processing, where the fifth data substream is at least one of the at least two lanes of data substreams, the sixth data substream is one lane of data substream that is in the at least two lanes of data substreams and on which delay processing is not performed, Q is a positive integer, and the second data stream obtained through the multiplex processing is a data stream obtained through the Q-stage processing; and separately performing encoding processing on each of the z lanes of twelfth data streams to obtain z lanes of third data streams.

It should be noted that, herein, Q-stage processing is separately performed on each of the z lanes of second data streams obtained through the multiplex processing. A specific process of the Q-stage processing may be understood with reference to the content described in (2). Details are not described herein again. In addition, encoding processing is separately performed on each of the z lanes of twelfth data streams. For details, refer to content described in subsequent step 303 for understanding. Details are not described herein.

A bit length of the thirteenth data stream is at least (N×Codeword length of the RS codeword)/(z×i) bits, where N is a positive integer, and i is a quantity of the data substreams. For details, refer to the sixth data stream described in (2) for understanding. Details are not described herein again.

It should be noted that the z lanes of obtained second data streams may be understood as data streams on which processing such as data alignment, deskewing, or reordering is not performed. In this embodiment of this application, during actual application, the m lanes of first data streams may be processed in another manner in addition to any manner in (1) to (3) above, to obtain the z lanes of second data streams. This is not limited herein.

303: Separately perform encoding processing on each of the z lanes of second data streams to obtain the z lanes of third data streams.

In this example, C inner-code sublayers are instantiated at the PMA layer based on an integer multiple of the quantity of physical coding sublayer lanes. That is, C is an integer multiple of B. In this way, after the z lanes of second data streams are obtained at the PMA layer, for each lane of second data stream, a one-to-one correspondence may be formed between each of the C/z inner-code sublayers and one lane of second data stream, and inner-code encoding processing is performed on corresponding second data streams by using the C/z inner-code sublayers separately, to generate corresponding data streams, namely, the third data streams, obtained through the inner-code encoding processing.

It should be understood that obtaining the z lanes of third data streams through the inner-code encoding processing may alternatively be understood as that each lane of data stream obtained through the encoding processing includes an FEC codeword. In some possible examples, the inner-code sublayer in this application may also be referred to as an inner-forward error correction (inner-forward error correction, Inner-FEC) coding sublayer. During actual application, another name may alternatively be used. This is not specifically limited in this application. In addition, the inner-code encoding processing may be understood as a second code in the concatenation code, and the concatenation code consists of the inner-code encoding processing and the RS encoding described in step 301.

For example, if there are 16 lanes of second data streams, namely, $F_1$, $F_2$, . . . , and $F_{16}$, obtained through processing, 16 inner-code encoding processing operations, namely, $H_1$, $H_2$, . . . , and $H_{16}$, are separately performed at the inner-code sublayer of the PMA layer. Then, inner-code encoding processing is performed on the data stream $F_1$ through the inner-code encoding processing operation $H_1$, inner-code encoding processing is performed on the data stream $F_2$ through the inner-code encoding processing operation $H_2$, . . . , and inner-code encoding processing is performed on the data stream $F_{16}$ through the inner-code encoding processing operation $H_{16}$. In some other examples, 32 inner-code encoding processing operations, namely, $H_1$, $H_2$, $H_3$, $H_4$, . . . , $H_{31}$, and $H_{32}$, may alternatively be separately performed at the inner-code sublayer. In addition, inner-code encoding processing is performed on the data stream $F_1$ through the two inner-code encoding processing operations $H_1$ and $H_2$, inner-code encoding processing is performed on the data stream $F_2$ through the two inner-code encoding processing operations $H_3$ and $H_4$, and by analogy, inner-code encoding processing is performed on the data stream $F_{16}$ through the two inner-code encoding processing operations $H_{31}$ and $H_{32}$. It should be noted that the 16 inner-code encoding processing operations and the 32 inner-code encoding processing operations are merely used as examples for description herein. During actual application, for the 16 lanes of second data streams, 64 inner-code encoding processing operations may alternatively be performed at the inner-code sublayer, and inner-code encoding processing is performed on each lane of second data stream through four different inner-code encoding processing operations. Alternatively, 128 inner-code encoding processing operations or the like may be performed provided that C is an integer multiple of z. This is not limited herein.

Alternatively, if there are 32 lanes of second data streams, namely, $F_1$, $F_2$, . . . , $F_{16}$, . . . , $F_{31}$, and $F_{32}$, obtained through processing, 32 inner-code encoding processing operations, namely, $H_1$, $H_2$, . . . , and $H_{32}$, are separately performed at the inner-code sublayer of the PMA layer. Then, inner-code encoding processing is performed on the data stream $F_1$ through the inner-code encoding processing operation $H_1$, inner-code encoding processing is performed on the data stream $F_2$ through the inner-code encoding processing operation $H_2$, . . . , inner-code encoding processing is performed on the data stream $F_{16}$ through the inner-code encoding processing operation $H_{16}$, . . . , and by analogy, and inner-code encoding processing is performed on the data stream $F_{32}$ through the inner-code encoding processing operation $H_{32}$. In some other examples, 64 inner-code encoding processing operations, namely, $H_1$, $H_2$, $H_3$, $H_4$, . . . , $H_{63}$, and $H_{64}$, may alternatively be performed at the inner-code sublayer. In addition, inner-code encoding processing is performed on the data stream $F_1$ through the two inner-code encoding processing operations $H_1$ and $H_2$, inner-code encoding processing is performed on the data stream $F_2$ through the two inner-code encoding processing operations $H_3$ and $H_4$, and by analogy, inner-code encoding processing is performed on the data stream $F_{32}$ through the two inner-code encoding processing operations $H_{63}$ and $H_{64}$. It should be noted that the 32 inner-code encoding processing operations and the 64 inner-code encoding processing operations that are performed at the inner-code sublayer are merely used as examples for description herein. During actual application, for the 32 lanes of second data streams, 128 inner-code encoding processing operations may alternatively be performed, and inner-code encoding processing is performed on each lane of second data stream through four different inner-code encoding processing operations; and so on. This is not limited herein.

It should be noted that the foregoing merely uses the 16 lanes of second data streams and the 32 lanes of second data streams as examples for description. During actual application, z may alternatively be another value, and a value of z depends on a requirement. This is not limited herein.

In some possible examples, because an inner-code encoding processing process may alternatively be actually understood as performing inner-code encoding on the to-be-encoded data block in the second data stream, inner-code encoding may be performed in different manners in different scenarios to enable a decoding sublayer to directly determine a boundary position of each codeword in a subsequent decoding process to improve decoding accuracy. For example, refer to the following two manners for understanding:

(1) Encoding processing is performed on a first data block to obtain one or more FEC codewords, where the first data block is at least C/z consecutive to-be-encoded data blocks in the corresponding second data stream, C is a positive integer, and C is an integer multiple of z; and a first identifier is inserted at a position of a codeword boundary of any one of the FEC codewords, where the first identifier identifies the codeword boundary of the FEC codeword, and a throughput or a baud rate of an FEC codeword obtained through insertion of the first identifier is an integer multiple of a reference clock.

In this example, the first data block is the at least C/z consecutive to-be-encoded data blocks in the corresponding second data stream, or may be understood as consisting of the at least C/z consecutive to-be-encoded data blocks. In addition, a length of the first data block is a sum of lengths of the at least C/z consecutive to-be-encoded data blocks. For example, each lane of second data stream includes the Y to-be-encoded data blocks in total that are $I_1$, $I_2$, . . . , and $I_Y$. If lengths of the to-be-encoded data blocks $I_1$, $I_2$, . . . , and $I_Y$ are k, when the first data block is $I_1$, the length of the first data block is correspondingly k. Similarly, when the first data block consists of $I_1$ and $I_2$, the length of the first data block is correspondingly 2k. It should be noted that the foregoing merely uses an example in which the lengths of $I_1$, $I_2$, . . . , and $I_Y$ are all k for description. During actual application, lengths of all to-be-encoded data blocks may alternatively be different. This is not limited herein.

In addition, a quantity of the obtained FEC codewords is related to a quantity of the to-be-encoded data blocks that the first data block consists of.

Figure 5A:
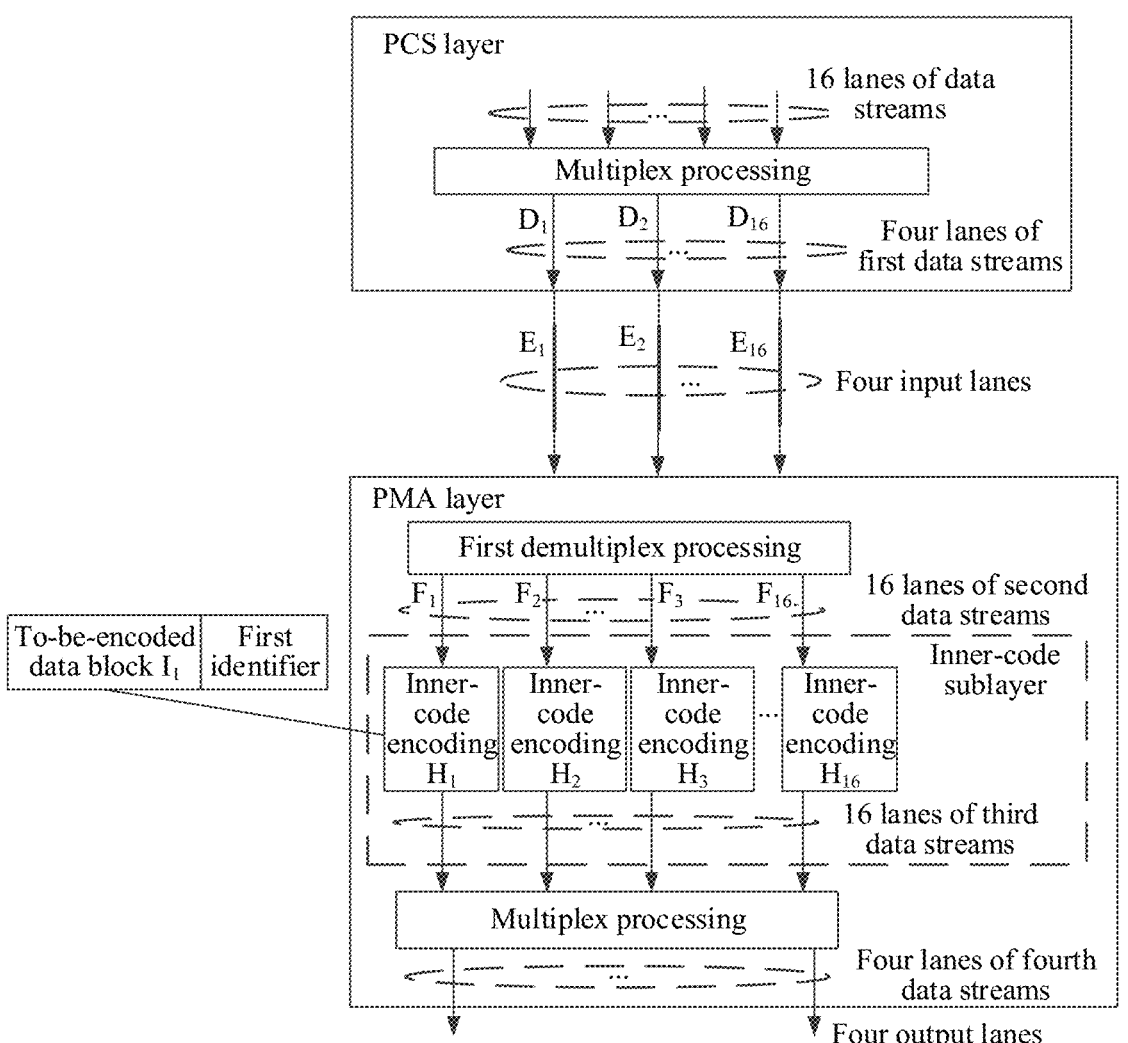
FIG. 5A is a schematic diagram of performing an inner-code encoding processing operation according to an embodiment of this application.

For example, if there are 16 lanes of second data streams, namely, $F_1$, $F_2$, . . . , and $F_{16}$, obtained through processing, the lane of second data stream $F_1$ includes Y to-be-encoded data blocks in total that are $I_1$, $I_2$, . . . , and $I_Y$. If the 16 inner-code encoding processing operations, namely, $H_1$, $H_2$, . . . , and $H_{16}$, are separately performed at the inner-code sublayer in this case, the first data block may be understood as one of the Y to-be-encoded data blocks $I_1$, $I_2$, . . . , and $I_Y$. In this way, when each inner-code encoding processing operation is performed, inner-code encoding processing may be performed on one of the first data blocks, to obtain a corresponding FEC codeword. In this case, one FEC codeword is obtained through the inner-code encoding processing operation. For example, FIG. 5A is a schematic diagram of performing an inner-code encoding processing operation according to an embodiment of this application. It can be learned from FIG. 5A that, inner-code encoding processing may be performed on the to-be-encoded data block $I_1$ (for example, k bits) in the second data stream $F_1$ by performing the inner-code encoding processing operation $H_1$, and one FEC codeword (for example, an FEC codeword 1) may be obtained in this case; inner-code encoding processing may be performed on a to-be-encoded data block $I_2$ in the second data stream $F_2$ by performing the inner-code encoding processing operation $H_2$, and one FEC codeword may be obtained in this case; . . . ; and by analogy, inner-code encoding processing may be performed on a to-be-encoded data block $I_{16}$ in the second data stream $F_{16}$ by performing the inner-code encoding processing operation $H_{16}$, and one FEC codeword may be obtained in this case. It should be noted that, in this application, an example in which inner-code encoding processing is performed on the to-be-encoded data block $I_1$ by performing the inner-code encoding processing operation $H_1$ is merely used for description. During actual application, inner-code encoding processing may alternatively be performed on the to-be-encoded data block $I_2$ or $I_3$ by performing the inner-code encoding processing operation $H_1$. This is not limited herein. In addition, the other inner-code encoding processing operations may also be understood with reference to the inner-code encoding processing operation $H_1$. Details are not described herein again. In addition, the other second data streams $F_2$, . . . , and $F_{16}$ may also be actually understood with reference to the second data stream $F_1$. Details are not described herein again.

Figure 5B:
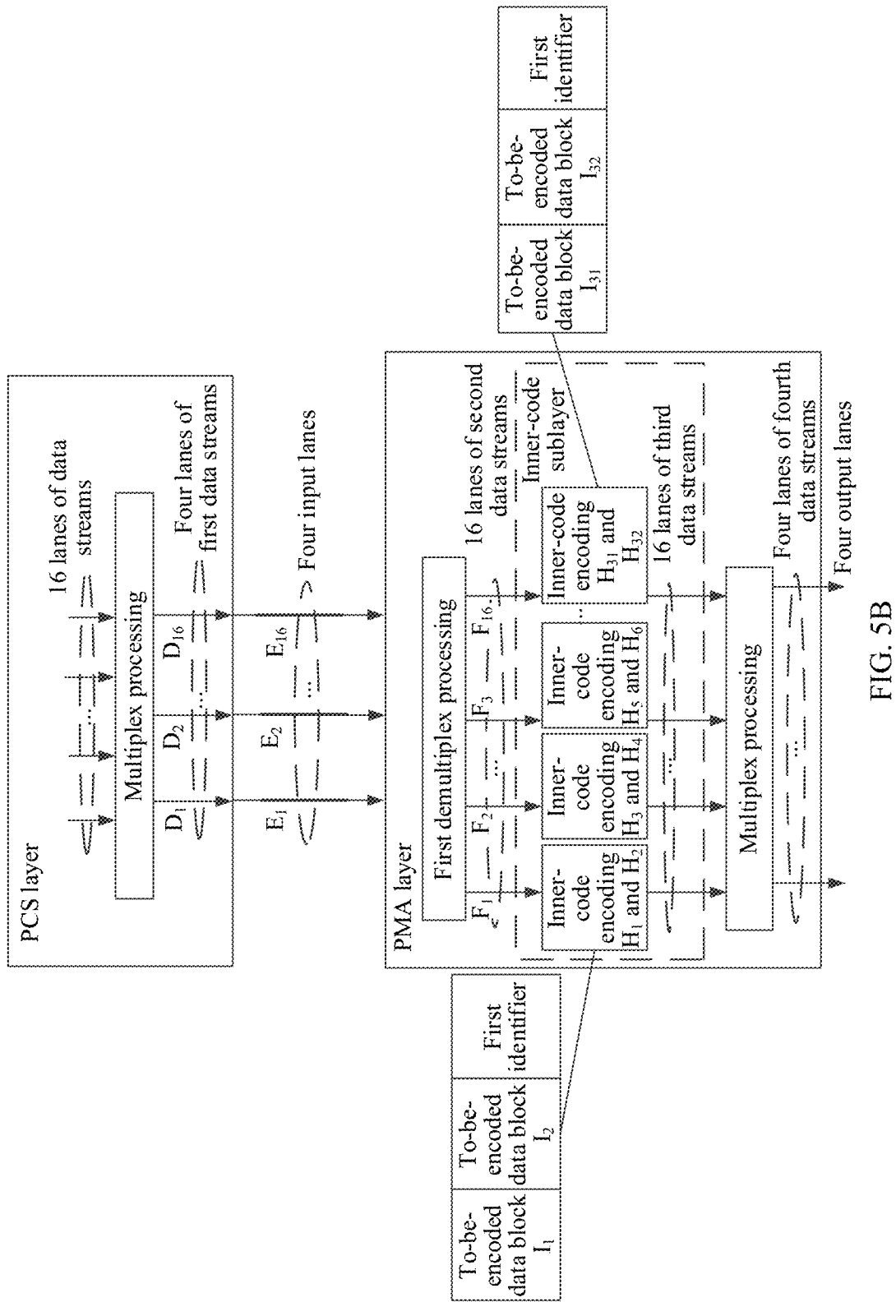
FIG. 5B is another schematic diagram of performing an inner-code encoding processing operation according to an embodiment of this application.

Alternatively, if there are still 16 lanes of second data streams obtained through processing, but the 32 inner-code encoding processing operations are performed at the inner-code sublayer in this case, the first data block may be understood as at least two consecutive to-be-encoded data blocks in the Y to-be-encoded data blocks $I_1, I_2, \ldots,$ and $I_Y$. For example, the first data block may consist of $I_1$ and $I_2$, or may consist of $I_3$ and $I_4$. This is not limited herein. For example, FIG. 5B is another schematic diagram of performing an inner-code encoding processing operation according to an embodiment of this application. It can be learned from FIG. 5B that, inner-code encoding processing may be performed, by performing the inner-code encoding processing operations $H_1$ and $H_2$, on a first data block (for example, k+k bits) consisting of $I_1$ and $I_2$ in the second data stream $F_1$, and two FEC codewords (for example, an FEC codeword 1 and an FEC codeword 2) may be obtained in this case; inner-code encoding processing may be performed, by performing the inner-code encoding processing operations $H_3$ and $H_4$, on a first data block consisting of $I_3$ and $I_4$ in the second data stream $F_2$, and two FEC codewords may be obtained in this case; . . . ; and by analogy, inner-code encoding processing may be performed, by performing the inner-code encoding processing operations $H_{31}$ and $H_{32}$, on a first data block consisting of $I_{31}$ and $I_{32}$ in the second data stream $F_{16}$, and two FEC codewords may be obtained in this case. It should be noted that, in this application, an example in which inner-code encoding processing is performed, by performing the inner-code encoding processing operation $H_1$ and $H_2$, on the first data block consisting of $I_1$ and $I_2$ is merely used for description. During actual application, inner-code encoding processing may alternatively be performed, by performing the inner-code encoding processing operations $H_1$ and $H_2$, on a first data block consisting of $I_3$ and $I_4$ in the second data stream $F_1$ or a first data block consisting of $I_{31}$ and $I_{32}$ in the second data stream $F_1$. This is not limited herein. In addition, the other inner-code encoding processing operations may also be understood with reference to the inner-code encoding processing operation $H_1$ and $H_2$. Details are not described herein again. In addition, the other second data streams $F_2, \ldots,$ and $F_{16}$ may also be actually understood with reference to the second data stream $F_1$. Details are not described herein again.

Alternatively, if there are still 16 lanes of second data streams obtained through processing, the 64 inner-code encoding processing operations may alternatively be performed at the inner-code sublayer. In this case, the first data block may be understood as four consecutive to-be-encoded data blocks in the Y to-be-encoded data blocks $I_1, I_2, \ldots,$ and $I_Y$. For example, the first data block may consist of $I_1$, $I_2$, $I_3$, and $I_4$, or may consist of $I_5$, $I_6$, $I_7$, and $I_8$. This is not limited herein. In this case, inner-code encoding processing may be performed, by performing the inner-code encoding processing operations $H_1$ to $H_4$, on a first data block (for example, k+k+k+k bits) consisting of $I_1$, $I_2$, $I_3$, and $I_4$ in the second data stream $F_1$, and four FEC codewords may be obtained in this case; inner-code encoding processing may be performed, by performing the inner-code encoding processing operations $H_5$ to $H_8$, on a first data block consisting of $I_5$, $I_6$, $I_7$, and Is in the second data stream $F_2$, and four FEC codewords may be obtained in this case; . . . ; and by analogy, inner-code encoding processing may be performed, by performing the inner-code encoding processing operations $H_{61}$ to $H_{64}$, on a first data block consisting of $I_{61}$, $I_{62}$, $I_{63}$, and $I_{64}$ in the second data stream $F_{16}$, and four FEC codewords may be obtained in this case. It should be noted that, in this application, an example in which inner-code encoding processing is performed, by performing the inner-code encoding processing operations $H_1$ to $H_4$, on the first data block consisting of $I_1$, $I_2$, $I_3$, and $I_4$ in the second data stream $F_1$ is merely used for description. During actual application, inner-code encoding processing may alternatively be performed, by performing the inner-code encoding processing operations $H_1$ to $H_4$, on a first data block consisting of $I_5$, $I_6$, $I_7$, and $I_8$ or a first data block consisting of $I_{61}$, $I_{62}$, $I_{63}$, and $I_{64}$ in the second data stream $F_1$. This is not limited herein. In addition, the other inner-code encoding processing operations may also be understood with reference to the inner-code encoding processing operation $H_1$ and $H_4$. Details are not described herein again. In addition, the other second data streams $F_2, \ldots,$ and $F_{16}$ may also be actually understood with reference to the second data stream $F_1$. Details are not described herein again.

It should be noted that z=16 is merely used as an example above. During actual application, there may alternatively be 32 lanes of second data streams, 64 lanes of second data streams, or the like. For details, refer to content of the foregoing 16 second data streams for understanding. Details are not described herein again.

In this way, after the FEC codeword is obtained, the first identifier may be further inserted at the position of the codeword boundary of any one of the FEC codewords. For example, as shown in FIG. 5A, the first identifier may be inserted at a position of a codeword boundary of the FEC codeword (for example, the FEC codeword 1) obtained by performing the inner-code encoding processing operation $H_1$. Alternatively, as shown in FIG. 5B, the first identifier may be inserted at a position of a codeword boundary of any one of the two FEC codewords (for example, the FEC codeword 1 and the FEC codeword 2) obtained by performing the inner-code encoding processing operation $H_1$ and $H_2$. For example, the first identifier is inserted at a position of a codeword boundary of the FEC codeword 1, or the first identifier is inserted at a position of a codeword boundary of the FEC codeword 2. This is not limited herein. It should be noted that, inserting the first identifier at the position of the codeword boundary of any one of the FEC codewords may alternatively be understood as inserting one first identifier at an interval of C/z FEC codewords.

It should be noted that the throughput or the baud rate of the FEC codeword obtained through the insertion of the first identifier is the integer multiple of the reference clock. For example, when a data transmission rate is represented by a throughput, assuming that a throughput of a data stream at the PCS layer is 850 Gbps, the throughput of the FEC codeword obtained through the insertion of the first identifier may be 910 Gbps. Alternatively, when a data transmission rate is represented by a baud rate, a baud rate of each physical coding sublayer lane at the PCS layer is 26.5625 Gbaud. After inner-code encoding processing is performed, a total length of the obtained FEC codeword is 180 bits. After the first identifier is inserted, a total length of the entire FEC codeword obtained through the insertion of the first identifier may change to 182 bits. In this case, the baud rate of the corresponding physical coding sublayer lane changes to 28.4375 Gbaud. For another example, assuming that a throughput of a data stream at the PCS layer is 850 Gbps, the throughput of the FEC codeword obtained through the insertion of the first identifier may be 900 Gbps. Alternatively, when a data transmission rate is represented by a baud rate, a baud rate of each physical coding sublayer lane at the PCS layer is 26.5625 Gbaud. After inner-code encoding processing is performed, a total length of the obtained FEC codeword is 179 bits. After the first identifier is inserted, a total length of the entire FEC codeword obtained through the insertion of the first identifier may change to 180 bits. In this case, the baud rate of the corresponding physical coding sublayer lane changes to 28.125 Gbaud.

Herein, an example in which the throughput is 850 Gbps and an example in which the baud rate is 26.5625 Gbaud are merely used for description. During actual application, a transmission rate of the data stream at the PCS layer should be related to load of the RS codeword. In addition, herein, examples in which the throughputs of the FEC codeword obtained through the insertion of the first identifier are 910 Gbps and 900 Gbps are merely used for description, and examples in which the baud rate of the physical coding sublayer lane changes to 28.4375 Gbaud and 28.125 Gbaud are merely used for description. This is not specifically limited in this application. The reference clock may be understood as 156.25 megahertz (MHz), or may be another value during actual application. This is not limited herein.

The foregoing reference clock indicates a data stream transmission frequency, namely, a quantity of times of transmission that may be performed per second. Both the baud rate and the throughput may represent a data stream transmission rate. The throughput represents a quantity of bits transmitted per second, and the baud rate represents a quantity of symbols transmitted per second. For example, five symbols may be transmitted each time, and 10 times of transmission may be performed per second. In this case, a total of 50 symbols may be transmitted per second.

In addition, the position of the codeword boundary may be understood as a codeword start and/or a codeword end. This is not limited herein. The codeword boundary of the FEC codeword is identified by the first identifier, so that a boundary position of each FEC codeword can be determined by directly identifying the first identifier in a subsequent decoding process, and a case in which inner-code decoding is ineffective in a case of delay skew and an unknown data start position is avoided.

It should be understood that the foregoing first identifier may be a preset identifier sequence, or may be obtained based on a bit value of the first data block. Descriptions are separately provided by using an example below.

① The first identifier is the preset identifier sequence.

Figure 6A:
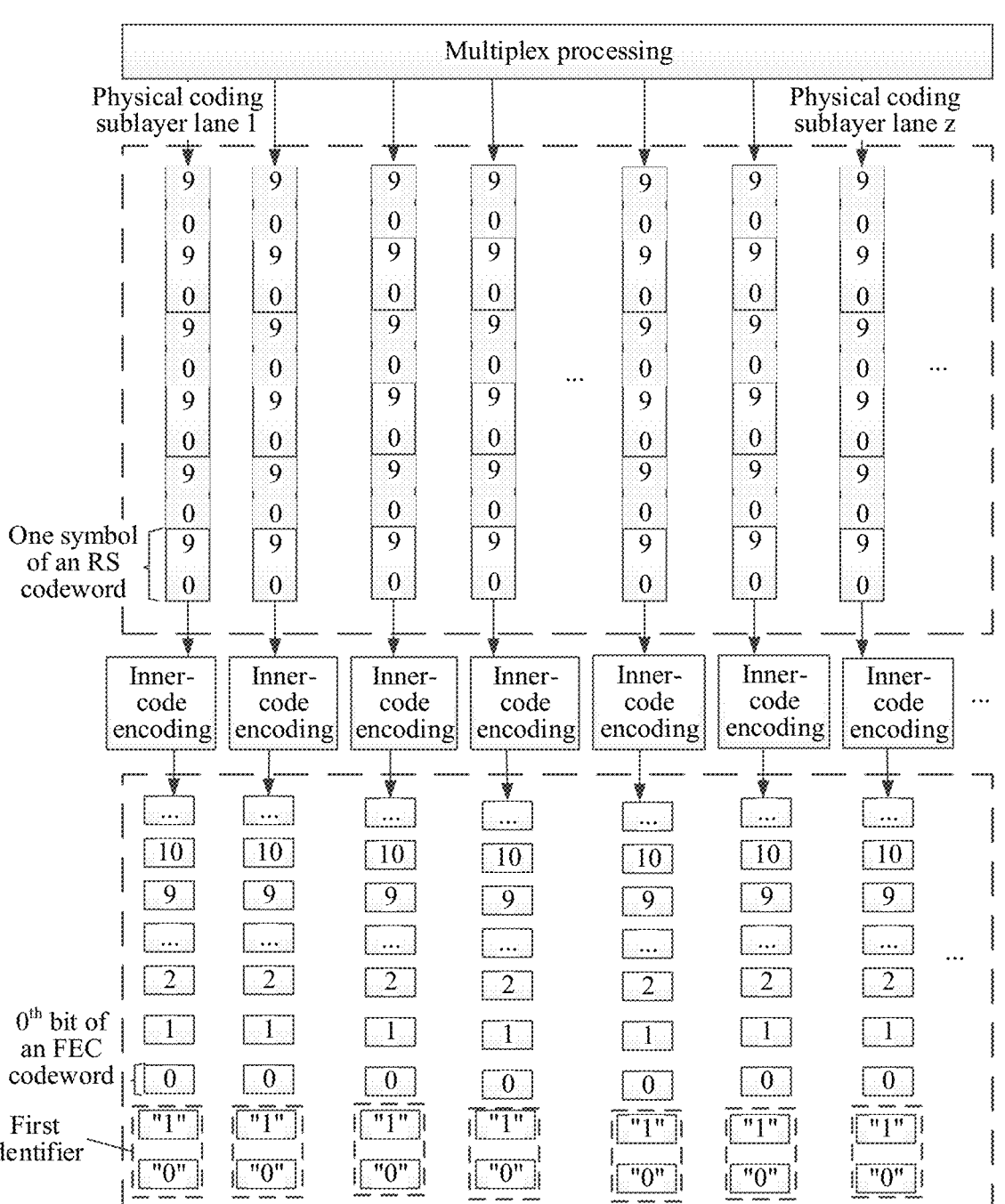
FIG. 6A is a schematic diagram of adding a first identifier according to an embodiment of this application.

In this example, the first identifier may be a sequence consisting of "1" and "0", or may be another known sequence. This is not limited herein. For example, FIG. 6A is a schematic diagram of inserting a first identifier according to an embodiment of this application. As shown in FIG. 6A, the first identifier, namely, a sequence consisting of "1" and "0", is added at a position of a codeword start of an FEC codeword, and the first identifier occupies two bits. Therefore, after the first identifier is added at a position of a codeword boundary of the FEC codeword, a total length of the codeword changes from n bits to n+2 bits. For example, if the length of the first data block is 170 bits, the total length of the FEC codeword is 180 bits after inner-code encoding processing is performed. After the first identifier is inserted, the length of the entire FEC codeword obtained through the insertion of the first identifier changes to 182 bits.

It should be noted that, when the first identifier is the preset identifier sequence, a sequence such as "101010" or "1010" may alternatively be selected as the first identifier. This is not limited herein.

② The first identifier is obtained based on the bit value of the first data block.

In this example, different first identifiers may alternatively be obtained for different bit values in the first data block. Specifically, the following two manners may be for determining:

Manner 1: The first identifier is obtained based on a value of a first bit in the first data block. It should be noted that the first bit is any one of at least one bit in the first data block.

Figure 6B:
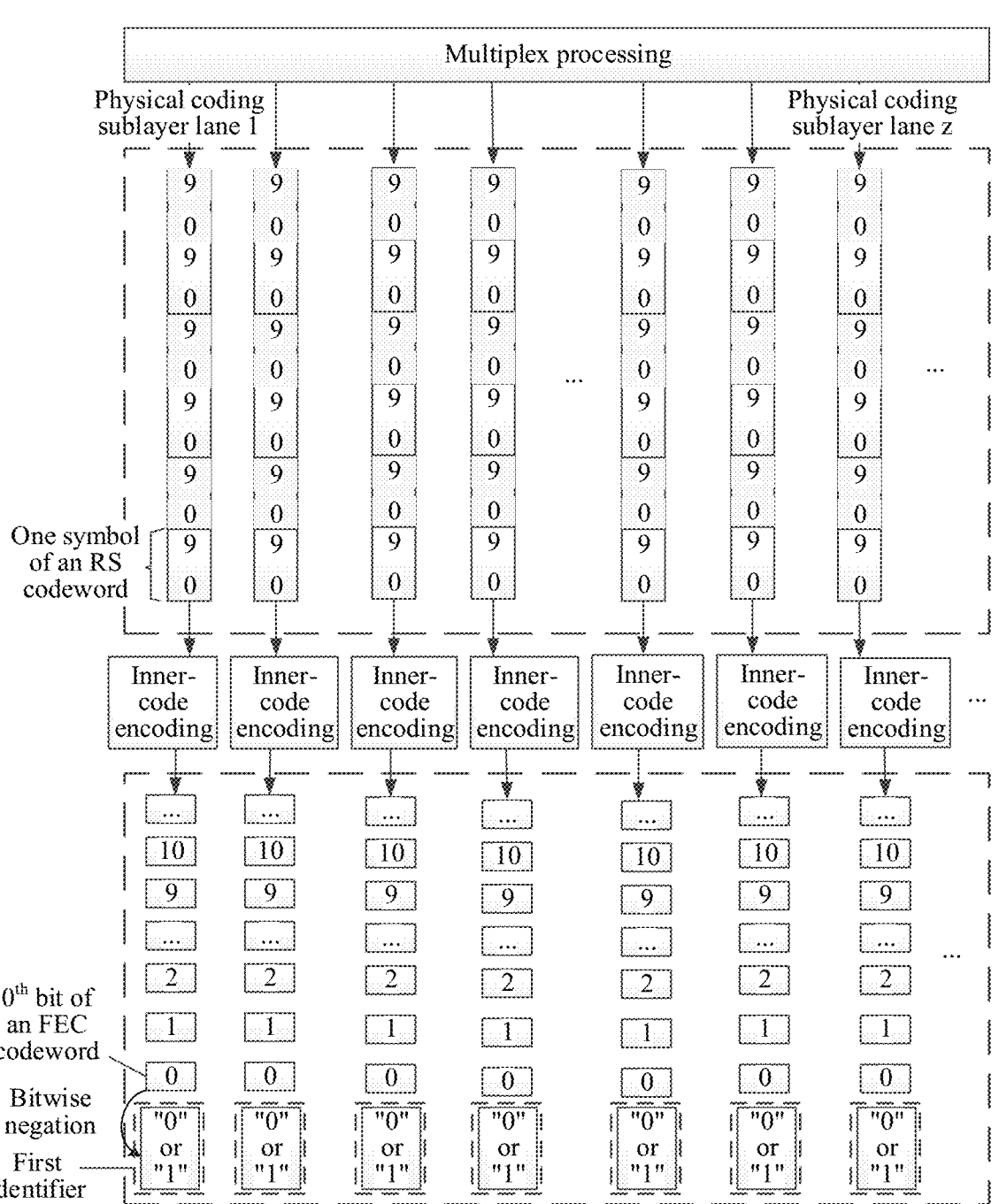
FIG. 6B is a schematic diagram of a value assignment manner of a first identifier according to an embodiment of this application.

For example, FIG. 6B is a schematic diagram of a value assignment manner of a first identifier according to an embodiment of this application. It can be learned from FIG. 6B that the first bit may be the $0^{th}$ bit in the first data block. If a value of the $0^{th}$ bit is "0", the first identifier, that is, "1", may be obtained by directly performing a negation operation on the value of the $0^{th}$ bit. Alternatively, if a value of the $0^{th}$ bit is "1", the first identifier, that is, "0", may be obtained by directly performing a negation operation on the value of the $0^{th}$ bit. This is not specifically limited herein. In addition, in FIG. 6B, an example in which the $0^{th}$ bit is the first bit is merely used for description. During actual application, the first bit may alternatively be the 1st bit, the 2nd bit, or the like in the first data block. This is not limited herein. For example, the length of the first data block is 180 bits. A last bit may be selected for negation. That is, a value of the $179^{th}$ bit is selected to directly perform a negation operation, to obtain the first identifier. The first identifier is obtained by performing a negation operation on a bit at a start position or an end position of the first data block. This helps the PMA layer at a receiving end quickly determine a codeword boundary.

Manner 2: The first identifier is obtained based on bit values of at least L second bits in the first data block, where there is an interval of s bits between every two adjacent second bits in the L second bits, L≥2, s≥0, and L and s are integers.

In this example, in the first data block, one second bit is selected at an interval of s bits, and a total of L second bits are selected. In this way, the L second bits may be processed through an exclusive OR operation, an OR operation, or an AND operation, to obtain the first identifier.

Figure 6C:
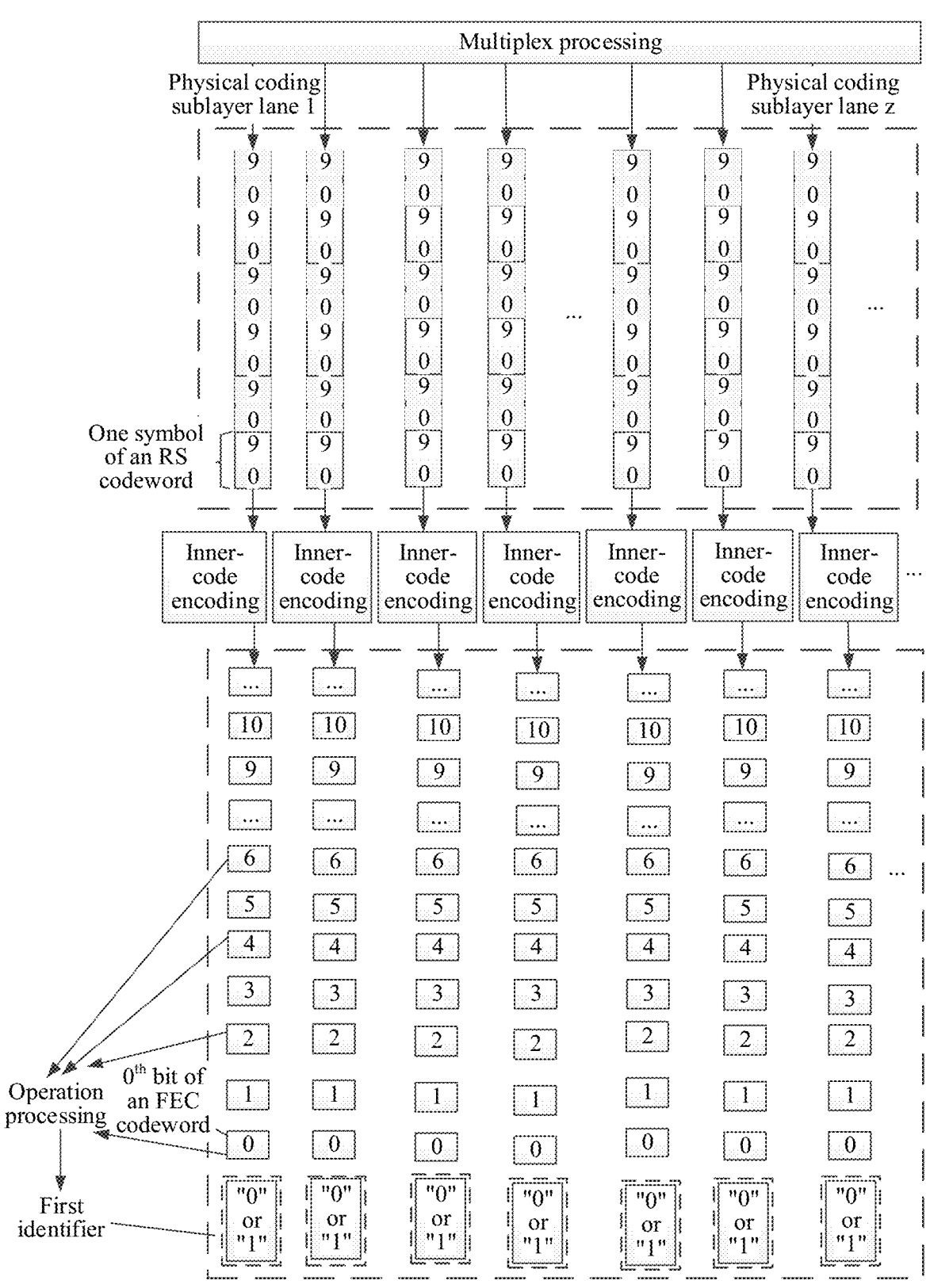
FIG. 6C is a schematic diagram of another value assignment manner of a first identifier according to an embodiment of this application.

For example, FIG. 6C is a schematic diagram of another value assignment manner of a first identifier according to an embodiment of this application. It can be learned from FIG. 6C that, when L=4, and s=2, the four second bits selected from the first data block are the $0^{th}$ bit, the 2nd bit, the $4^{th}$ bit, and the $6^{th}$ bit. In this way, bit values corresponding to the $0^{th}$ bit, the 2nd bit, the $4^{th}$ bit, and the $6^{th}$ bit are processed through the exclusive OR operation, and a processing result may be used as the first identifier. It should be noted that, in some examples, the four selected second bits may alternatively be the 1st bit, the 3rd bit, the $5^{th}$ bit, and the $7^{th}$ bit; or the like. This is not limited herein.

It should be noted that an example in which L is 4 and s is 2 is merely used for description in FIG. 6C. During actual application, L may alternatively be 8, and s is 3; L is 6, and s is 4; or the like. In this application, neither a value of L nor a value of s is limited.

In addition, during actual application, the first identifier may be determined in another manner in addition to ① and ② above. This is not specifically limited in this application.

(1) above mainly describes the solution in which inner-code encoding is first performed on the first data block and then the first identifier is inserted. The following describes a solution in which a first identifier also participates in the inner-code encoding. Details are as follows.

(2) The first identifier is inserted into each to-be-encoded data block in a first data block to obtain a second data block, where the first data block is C/z consecutive to-be-encoded data blocks, C is a positive integer, and C is an integer multiple of z; and inner-code encoding processing is performed on the second data block to obtain an FEC codeword. It should be noted that a throughput or a baud rate of the FEC codeword is an integer multiple of a reference clock.

In this example, the second data block may be understood as consisting of the first data block and the first identifier, and a length of the second data block is a sum of a length of the first data block and a quantity of bits occupied by the first identifier. In this way, the first identifier is inserted into each to-be-encoded data block in the first data block. For example, when the first data block shown in FIG. 5B consists of the to-be-encoded data blocks $I_1$ and $I_2$, the first identifier may be inserted at a position of a codeword boundary of the to-be-encoded data block $I_1$, and the first identifier may be inserted at a position of a codeword boundary of the to-be-encoded data block $I_2$. If the length of the first data block is k (that is, the first data block occupies k bits), and the first identifier occupies one bit, the length of the second data block is k+2 bits.

Inner-code encoding processing may be performed on a second data block in each lane of second data stream. Refer to the process of performing inner-code encoding processing on the first data block in (1) for understanding. Details are not described herein again. In addition, the first data block may be understood with reference to content in (1). Details are not described herein again. In addition, the first identifier may alternatively be understood with reference to the content described in ① and ②. Details are not described herein again.

In some other possible examples, the encoding method may further include: identifying an alignment marker in the lane of second data stream, where the alignment marker identifies a symbol boundary in the corresponding second data stream; and determining the symbol boundary in the corresponding second data stream based on the alignment marker.

In this example, at the PCS layer, a common alignment marker of an AM alignment block is added to each of the m lanes of first data streams. After the m lanes of first data streams are mapped to obtain the z lanes of second data streams, each lane of second data stream includes the corresponding alignment marker, and the symbol boundary in the lane of second data stream is identified by the alignment marker. Therefore, at the PMA layer, after the m lanes of first data streams are processed in any one of the possible manners in FIG. 4A to FIG. 4F to obtain the z lanes of second data streams, the alignment marker included in each lane of second data stream may be further identified. After the corresponding alignment marker is identified, the alignment marker is locked, so that the symbol boundary in the corresponding second data stream may be determined. For example, an AM alignment block of a 120-bit known sequence is added to each lane of first data stream, and there is a 48-bit common alignment marker in the AM alignment block of the 120-bit known sequence. In this case, locking and alignment may be implemented provided that the 48-bit common alignment marker is identified in an operation at a symbol boundary of the RS codeword.

Then, inner-code encoding processing is separately performed on the z lanes of second data streams. For details, refer to the content described in step 303 for understanding. Details are not described herein again.

Figure 7:
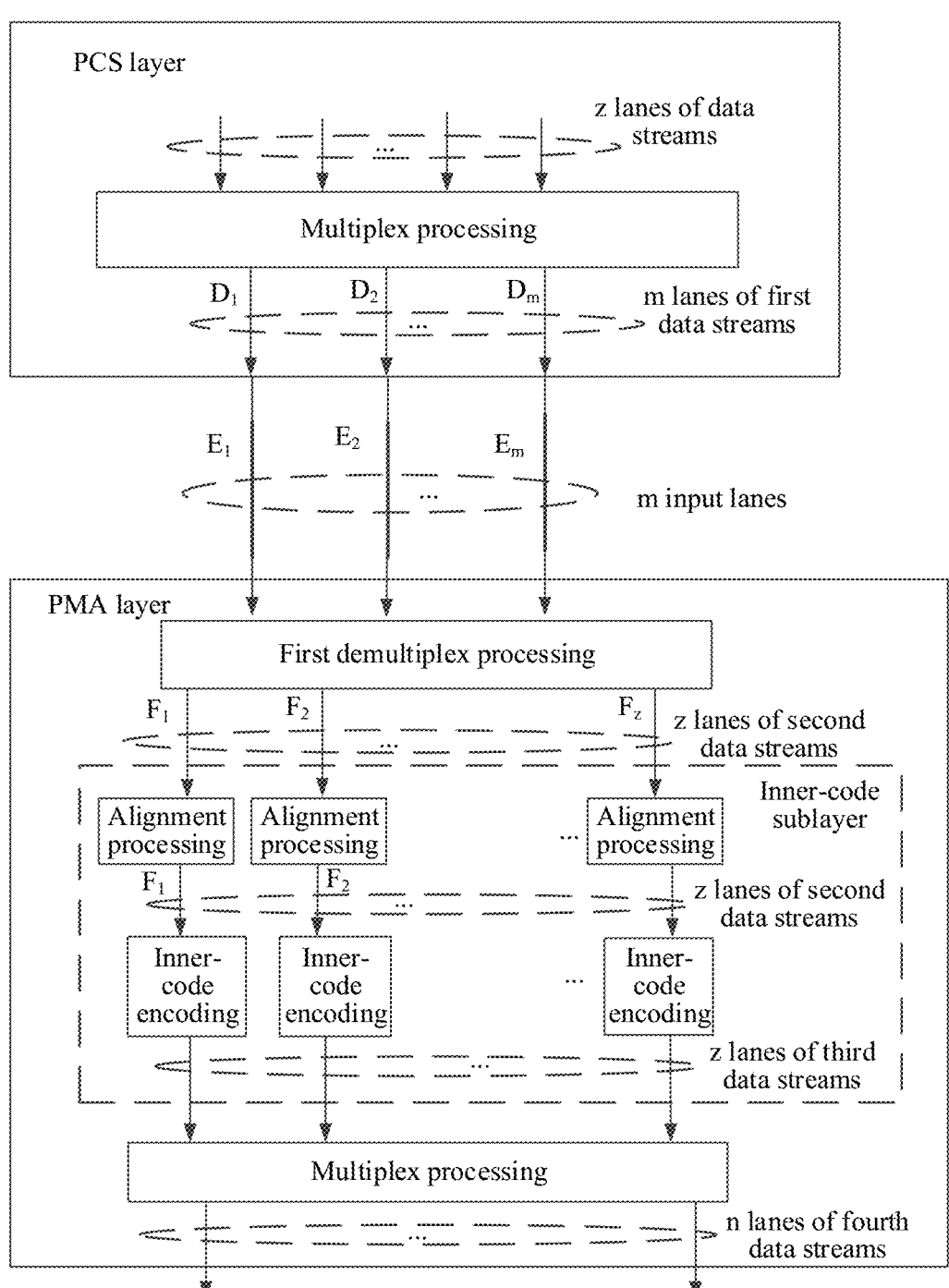
FIG. 7 is another schematic diagram of transmission of data streams in an encoding process according to an embodiment of this application.

For example, FIG. 7 is another schematic diagram of data stream transmission according to an embodiment of this application. As shown in FIG. 7, based on the embodiment described in any one of FIG. 4A to FIG. 4F, at the inner-code sublayer of the PMA layer, alignment processing may be separately performed on the z lanes of second data streams, and then inner-code encoding processing is separately performed.

304: Perform multiplex processing on the z lanes of third data streams to obtain the n lanes of fourth data streams, where n is a positive integer.

In this example, after the z lanes of third data streams are obtained at the PMA layer, if the PMA layer intends to send the z lanes of third data streams to a receiving end through n output lanes, the PMA layer still needs to perform multiplex processing on the z lanes of third data streams to obtain the n lanes of fourth data streams, and then transmits the n lanes of fourth data streams to a PMA layer at the receiving end through the n output lanes.

For example, the PMA layer multiplexes the z lanes of third data streams based on a third ratio (that is, z/n), to obtain the n lanes of fourth data streams. Alternatively, the PMA layer may first multiplex the z lanes of third data streams based on a fourth ratio (that is, z/m), to obtain m lanes of data streams, and then perform multiplex processing on the m lanes of data streams based on a fifth ratio (that is, m/n), to obtain the n lanes of fourth data streams. A specific manner is not limited in this application. It should be noted that a value of n may be 4, 8, 16, or the like. This is not limited herein.

For example, FIG. 8 is a schematic diagram of overall transmission of data streams at a PMA layer. As shown in FIG. 8, m lanes of first data streams are obtained through the m input lanes, and first demultiplex processing is performed on the m lanes of first data streams based on a ratio of m/z, to obtain z lanes of PCS lane data streams, namely, the z lanes of second data streams. Then, C inner-code encoding processing operations at the inner-code sublayer are performed to separately perform encoding processing on the z lanes of PCS lane data streams to obtain the z lanes of third data streams, where the inner-code encoding processing of each lane of PCS lane data stream is implemented through C/z inner-code encoding processing operations. Then, multiplex processing is performed on the z lanes of third data streams based on z/n, to obtain the n lanes of fourth data streams, and the n lanes of fourth data streams are transmitted through the n output lanes.

FIG. 3 to FIG. 8 mainly describe the encoding method provided in embodiments of this application. The following describes a decoding method provided in embodiments of this application. FIG. 9 is a schematic flowchart of a decoding method according to an embodiment of this application. As shown in FIG. 9, the decoding method may include the following steps.

901: Obtain n lanes of fourth data streams through n input lanes.

In this example, after obtaining the n lanes of fourth data streams, a PMA layer at a transmitting end may send the n lanes of fourth data streams to a PMD layer. After processing such as optical-electrical conversion is performed on the n lanes of fourth data streams at the PMD layer, signals may be transmitted to a PMD layer at a receiving end by using a transmission medium or the like. Then, at the receiving end, the PMD layer performs conversion processing on the signals received from the transmission medium, to obtain the n lanes of fourth data streams. Then, the PMD layer may transmit the n lanes of fourth data streams to a PMA layer on a receiving end side through n output lanes. In this way, the PMA layer may obtain the n lanes of fourth data streams through the n input lanes.

902: Perform demultiplex processing on the n lanes of fourth data streams to obtain z lanes of third data streams.

After the n lanes of fourth data streams are obtained at the PMA layer, demultiplex processing may be performed on the n lanes of fourth data streams based on a reciprocal of a third ratio, to obtain the z lanes of third data streams. The third ratio may be understood with reference to step 304 in FIG. 3. Details are not described herein again.

903: Separately perform decoding processing on each of the z lanes of third data streams to obtain z lanes of second data streams.

In this example, a decoding processing procedure is an inverse process of the encoding processing in FIG. 3. For the z lanes of third data streams, C inner-code decoding processing operations may also be performed at an inner-code sublayer, so as to separately perform inner-code decoding processing on one lane of third data stream by performing C/z different inner-code decoding processing operations.

In some other possible examples, the decoding method may further include: identifying, based on a first identifier and/or a decoding flag bit, a codeword boundary of FEC codeword obtained through encoding, where the decoding flag bit indicates whether the inner-code decoding processing is successful.

The z lanes of third data streams each include a corresponding first identifier. In a process of decoding the corresponding third data streams, a position of a codeword boundary of an FEC codeword in each lane of third data stream may be learned of by identifying the first identifier and/or a decoding flag bit, so that decoding efficiency and decoding accuracy are further improved. For example, when identifying that each identifier value in the first identifier is correct, the PMA layer may further determine, by using the decoding flag bit, whether inner-code decoding processing is successful; and when the decoding flag bit indicates that the inner-code decoding processing is successful, the PMA layer identifies the codeword boundary of the FEC codeword based on the first identifier, thereby performing decoding processing on the FEC codeword obtained through encoding.

It should be noted that, the identifying, based on a first identifier and/or a decoding flag bit, a codeword boundary of FEC codeword obtained through encoding may be understood as three cases. To be specific, ① the codeword boundary of the FEC codeword obtained through the encoding may be identified based on the first identifier; ② the codeword boundary of the FEC codeword obtained through the encoding may be identified based on the decoding flag bit; and ③ the codeword boundary of the FEC codeword obtained through the encoding may be identified based on the first identifier and the decoding flag bit. A specific manner is not limited in this application. In addition, the foregoing decoding flag bit may be fed back in a decoding processing process, or may not be fed back. This is not limited herein.

904: Perform multiplex processing on the z lanes of second data streams based on a first ratio, to obtain m lanes of first data streams.

In this example, after obtaining the z lanes of second data streams, the PMA layer performs multiplex processing on the z lanes of second data streams based on the first ratio, to obtain the m lanes of first data streams. For example, when z=16, the first ratio may be 16:4, and four lanes of first data streams are obtained through the multiplex processing.

FIG. 10A is a schematic diagram of transmission of data streams in a decoding process according to an embodiment of this application. It can be learned from FIG. 10A that demultiplex processing is first performed on n lanes of fourth data streams to obtain z lanes of third data streams. Then, inner-code decoding processing is separately performed on the z lanes of third data streams at an inner-code sublayer to obtain z lanes of second data streams. Finally, the z lanes of second data streams are processed.

In some other optional examples, an electrical signal is obtained through optical-electrical conversion at a PMD layer, a data and clock recovery operation first needs to be performed on the electrical signal by a CDR unit. Shorter time needed by the CDR unit to recover a clock and data is more favorable to a system. Based on this, the decoding method may further include: generating a first signal based on the first identifier and/or the decoding flag bit before identifying the codeword boundary of the FEC codeword based on the first identifier and/or the decoding flag bit, where the first signal is for determining data and clock information.

FIG. 10B is another schematic diagram of transmission of data streams in a decoding process according to an embodiment of this application. It can be learned from FIG. 10B that, based on FIG. 10A, before z lanes of third data streams are obtained through demultiplex processing, clock and data recovery processing is first performed on n lanes of fourth data streams. Then, demultiplex processing is performed on n lanes of fourth data streams obtained through the clock and data recovery processing, to obtain the z lanes of third data streams, and then inner-code decoding processing is separately performed on the z lanes of third data streams. It should be noted that a CDR unit uniquely corresponds to a data stream received in an input lane. In addition, there is a unique correspondence between each input lane and a physical coding sublayer lane, and each physical coding sublayer lane corresponds to C/z inner-code decoding processing operations. Therefore, a decoding unit connected to each CDR unit is also fixed, and the decoding unit and the CDR unit may be connected through a connection line. For example, there are four input lanes at a PMD layer, and there are 16 physical coding sublayer lanes at a PMA layer. If 32 inner-code decoding processing operations may be performed at an inner-code sublayer, each physical coding sublayer lane is correspondingly connected to two decoding units. In a process of recovering data and a clock by the CDR unit, the inner-code sublayer may first detect a first identifier and/or a decoding flag bit, to generate a feedback signal, namely, a first signal. In this case, when the CDR unit receives the first signal, a process of recovering the data and the clock by the CDR unit may be accelerated, data and clock information is determined in advance, and time needed for system locking is reduced. In addition, in terms of a design of a generation manner of a sequence corresponding to the first identifier in this application, an autocorrelation feature of the sequence corresponding to the first identifier is considered, which helps the first identifier be detected more quickly; and a fixed 0-1 transition feature of the first identifier is considered, which helps a convergence speed of the data and clock recovery of the CDR unit.

In addition, if the CDR unit first receives, before receiving the first signal, a signal that is fed back by the CDR unit and that is for normally recovering the data and the clock, the CDR unit may enter a lock state based on the signal for normally recovering the data and the clock, to complete a data and clock recovery operation.

In some other examples, after obtaining m lanes of first data streams, the PMA layer may alternatively send the m lanes of first data streams to a PCS layer through m output lanes. In this way, after obtaining the m lanes of first data streams through the m input lanes, the PCS layer performs demultiplex processing on the m lanes of first data streams based on a second ratio, to obtain z lanes of eleventh data streams. It should be noted that the z lanes of eleventh data streams correspond to z lanes of data streams obtained through RS encoding processing. The PCS layer may further perform RS decoding processing, 256B/257B transcoding processing, and 64B/66B encoding processing on the z lanes of eleventh data streams sequentially. For details, refer to FIG. 1A for understanding.

Compared with the existing solution shown in FIG. 1A and FIG. 1B, in embodiments of this application, inner-code encoding processing is separately performed on each of the z lanes of second data streams at the PMA layer to obtain the z lanes of third data streams, and an FEC codeword in each third data stream obtained through the encoding includes a boundary identifier. This ensures that the inner-code encoding is decoupled from data obtained through encoding at an upper-layer PCS layer, ensures that the inner-code encoding is decoupled from transmission at a lower-layer PMD layer, and can reduce a delay of processing the delay skew and disorder, so that the inner-code encoding and decoding in this application are applicable to a scenario sensitive to a transmission delay. In addition, a codeword boundary of each lane of third data stream can be determined provided that a boundary identifier in the lane of the third data stream is identified, so as to separately perform inner-code decoding processing on each of the z lanes of third data streams, without performing operations such as deskewing and reordering on the data streams, which reduces operation complexity and a delay.

The foregoing mainly describes, from a perspective of the method, the solutions provided in embodiments of this application. It may be understood that, to implement the foregoing functions, the PMA layer includes a corresponding hardware structure and/or software module for executing each function. Persons skilled in the art should be easily aware that, in combination with the functions described in embodiments disclosed in this specification, this application can be implemented by hardware or a combination of hardware and computer software. Whether a function is performed by hardware or hardware driven by computer software depends on particular applications and design constraints of the technical solutions. Persons skilled in the art may use different methods to implement the functions for each particular application, but it should not be considered that the implementation goes beyond the scope of this application.

From a perspective of a physical device, specifically, the PMA layer may be implemented by one physical device, for example, an optical module, or another encoding apparatus or decoding apparatus, may be jointly implemented by a plurality of physical devices, or may be a logical functional unit in one physical device. This is not specifically limited in embodiments of this application.

For example, the PMA layer may be implemented by a communication device in FIG. 11. FIG. 11 is a schematic diagram of a hardware structure of a communication device according to an embodiment of this application. The communication device includes at least one processor 1101, a memory 1102, and a transceiver 1103.

The processor 1101 may be a general-purpose central processing unit CPU, a microprocessor, an application-specific integrated circuit, or one or more integrated circuits configured to control program execution of the solutions in this application. The processor 1101 can perform operations, for example, determining, analysis, and operation, including: processing m lanes of first data streams to obtain z lanes of second data streams; separately performing inner-code encoding processing on each of the z second data streams to obtain z lanes of third data streams; and the like.

The transceiver 1103 is any apparatus such as a transceiver, and is configured to communicate with another device or a communication network such as the Ethernet, a radio access network (RAN), or a wireless local area network (WLAN). The transceiver 1103 may be connected to the processor 1101. The transceiver 1103 may obtain the m lanes of first data streams and the like.

The memory 1102 may be a read-only memory (ROM) or another type of static storage device that can store static information and instructions, or a random access memory (RAM) or another type of dynamic storage device that can store information and instructions, or may be an electrically erasable programmable read-only memory (EEPROM), a compact disc read-only memory (CD-ROM) or another compact disc storage, an optical disc storage (including a compressed optical disc, a laser disc, an optical disc, a digital versatile disc, a Blu-ray disc, or the like), a magnetic disk storage medium or another magnetic storage device, or any other medium that can be for carrying or storing expected program code in a form of instructions or a data structure and that can be accessed by a computer, but is not limited thereto. The memory 1102 may exist independently, or may be connected to the processor 1101. The memory 1102 may alternatively be integrated with the processor 1101.

The memory 1102 is configured to store computer-executable instructions for performing the solutions in this application, and execution is controlled by the processor 1101. The processor 1101 is configured to execute the computer-executable instructions stored in the memory 1102, to implement the encoding method and the decoding method provided in the foregoing method embodiments of this application.

In a possible implementation, the computer-executable instructions in this embodiment of this application may also be referred to as application program code. This is not specifically limited in this embodiment of this application.

During specific implementation, in an embodiment, the processor 1101 may include one or more CPUs such as a CPU 0 and a CPU 1 in FIG. 11.

From a perspective of functional units, in this application, the PMA layer may be divided into functional units based on the foregoing method embodiments. For example, each functional unit may be obtained through division based on each corresponding function, or two or more functions may be integrated into one functional unit. The integrated functional unit may be implemented in a form of hardware, or may be implemented in a form of a software functional unit.

For example, when each functional unit is obtained through division in an integrated manner, FIG. 12 is a schematic diagram of a structure of an encoding apparatus according to an embodiment of this application. As shown in FIG. 12, an embodiment of the encoding apparatus in this application may include a first obtaining unit 1201 and a first processing unit 1202.

The first obtaining unit 1201 is configured to obtain m lanes of first data streams through m input lanes, where m is a positive integer. For details, refer to content of step 301 in FIG. 3 for understanding. Details are not described herein again.

The first processing unit 1202 is configured to: process the m lanes of first data streams to obtain z lanes of second data streams; separately perform encoding processing on each of the z lanes of second data streams to obtain z lanes of third data streams; and perform multiplex processing on the z lanes of third data streams to obtain n lanes of fourth data streams, where n and z are both positive integers. For details, refer to content of steps 302 to 304 in FIG. 3 for understanding. Details are not described herein again.

In some possible implementations, each of the z lanes of second data streams includes a to-be-encoded data block, and the first processing unit 1202 is configured to: perform encoding processing on a first data block to obtain one or more FEC codewords, where the first data block is at least C/z consecutive to-be-encoded data blocks in the corresponding second data stream, C is a positive integer, and C is an integer multiple of z; and insert a first identifier at a position of a codeword boundary of any one of the FEC codewords, where the first identifier identifies the codeword boundary of the FEC codeword, and a throughput or a baud rate of an FEC codeword obtained through insertion of the first identifier is an integer multiple of a reference clock. For details, refer to content of step 303 in FIG. 3 for understanding. Details are not described herein again.

In some possible implementations, each of the z lanes of second data streams includes a to-be-encoded data block, and the first processing unit 1202 is configured to: insert a first identifier into each to-be-encoded data block in a first data block to obtain a second data block, where the first data block is C/z consecutive to-be-encoded data blocks, C is a positive integer, and C is an integer multiple of z; and perform encoding processing on the second data block to obtain an FEC codeword, where a throughput or a baud rate of the FEC codeword is an integer multiple of a reference clock. For details, refer to content of step 303 in FIG. 3 for understanding. Details are not described herein again.

In some possible implementations, the first identifier is a preset identifier sequence. For details, refer to content of step 303 in FIG. 3 for understanding. Details are not described herein again.

In some possible implementations, the first identifier is obtained based on a value of a first bit in the first data block, where the first bit is any one of at least one bit in the first data block; or the first identifier is obtained based on bit values of at least L second bits in the first data block, where there is an interval of s bits between every two adjacent second bits in the L second bits, $L \geq 2$, $s \geq 0$, and L and s are integers. For details, refer to content of step 303 in FIG. 3 for understanding. Details are not described herein again.

In some possible implementations, the first processing unit 1202 is configured to perform demultiplex processing on the m lanes of first data streams based on a second ratio, to obtain the z lanes of second data streams, where the second ratio is a ratio of m to z.

In some possible implementations, the first processing unit 1202 is configured to: perform demultiplex processing on the m lanes of first data streams based on the second ratio, to obtain z lanes of fifth data streams; and separately perform Q-stage processing on each of the z lanes of fifth data streams to obtain the z lanes of second data streams, where each stage of processing in the Q-stage processing includes: performing round-robin distribution processing on a data stream obtained at a previous stage, to obtain at least two lanes of data substreams; performing delay processing on a first data substream to obtain a sixth data stream; and performing multiplex processing on a second data substream and the sixth data stream to obtain an output data stream obtained through current-stage processing, where the first data substream is at least one of the at least two lanes of data substreams, the second data substream is one lane of data substream that is in the at least two lanes of data substreams and on which delay processing is not performed, Q is a positive integer, and the second data stream is a data stream obtained through the Q-stage processing.

In some possible implementations, a bit length of the sixth data stream is at least (N×Codeword length of an RS codeword)/(z×i) bits, where N is a positive integer, and i is a quantity of the data substreams.

In some possible implementations, the first obtaining unit 1201 is further configured to obtain m lanes of seventh data streams through the m input lanes; and the first processing unit 1202 is configured to: perform demultiplex processing on the m lanes of seventh data streams based on a second ratio, to obtain z lanes of eighth data streams; and perform multiplex processing on the z lanes of second data streams and the z lanes of eighth data streams to obtain z second data streams obtained through the multiplex processing.

In some possible implementations, the first processing unit 1202 is further configured to: identify an alignment marker in each lane of second data stream, where the alignment marker identifies a symbol boundary in the corresponding second data stream; and determine the symbol boundary in the corresponding second data stream based on the alignment marker.

In some possible implementations, the m lanes of first data streams are obtained by performing, at a first ratio, multiplex processing on z lanes of data streams obtained through Reed-Solomon RS encoding.

The encoding apparatus provided in this embodiment of this application is configured to perform the encoding method in the method embodiment corresponding to FIG. 3. Therefore, this embodiment of this application may be understood with reference to a related part in the method embodiment corresponding to FIG. 3.

The foregoing mainly describes, from a perspective of function modules, the encoding apparatus provided in embodiments of this application. The following describes, from a perspective of function modules, a decoding apparatus provided in embodiments of this application. FIG. 13 is a schematic diagram of a structure of a decoding apparatus according to an embodiment of this application. As shown in FIG. 13, an embodiment of the decoding apparatus in this application may include a second obtaining unit 1301 and a second processing unit 1302.

The second obtaining unit 1301 is configured to obtain n lanes of fourth data streams through n input lanes. For details, refer to content of step 901 in FIG. 9 for understanding. Details are not described herein again.

The second processing unit 1302 is configured to: perform demultiplex processing on the n lanes of fourth data streams to obtain z lanes of third data streams; separately perform decoding processing on each of the z lanes of third data streams to obtain z lanes of second data streams; and perform multiplex processing on the z lanes of second data streams based on a first ratio, to obtain m lanes of first data streams, where the first ratio and a second ratio are reciprocal to each other. For details, refer to content of steps 902 to 904 in FIG. 9 for understanding. Details are not described herein again.

In some possible implementations, the z lanes of third data streams include a first identifier, and the first identifier identifies a codeword boundary of an FEC codeword; and the second processing unit 1302 is further configured to: identify the codeword boundary of the FEC codeword based on the first identifier and/or a decoding flag bit, where the decoding flag bit indicates whether the decoding processing is successful.

In some other possible implementations, the second processing unit 1302 is further configured to generate a first signal based on the first identifier and/or the decoding flag bit before identifying the codeword boundary of the FEC codeword based on the first identifier and/or the decoding flag bit, where the first signal is for determining data and clock information. It should be noted that the first signal can be for determining the data and clock information, so that a CDR unit accelerates a process of data and clock recovery, the data and clock information is determined in advance, time needed for system locking is reduced, and determining of a system transmission frequency in advance is facilitated. In addition, in terms of a design of a generation manner of a sequence corresponding to the first identifier in this application, an autocorrelation feature of the sequence corresponding to the first identifier is considered, which helps the first identifier be detected more quickly; and a fixed 0-1 transition feature of the first identifier is considered, which helps a convergence speed of the data and clock recovery of the CDR unit. It should be noted that, if the CDR unit first receives, before receiving the first signal, a signal that is fed back by the CDR unit and that is for normally recovering data and a clock, the CDR unit may enter a lock state based on the signal for normally recovering the data and the clock, to complete a data and clock recovery operation.

The decoding apparatus provided in this embodiment of this application is configured to perform the decoding method in the method embodiment corresponding to FIG. 9. Therefore, this embodiment of this application may be understood with reference to a related part in the method embodiment corresponding to FIG. 9.

In embodiments of this application, the encoding apparatus and the decoding apparatus each are presented in a form of functional units obtained through division in an integrated manner. The "functional unit" herein may be an application-specific integrated circuit (ASIC), a processor and a memory that execute one or more software or firmware programs, an integrated logic circuit, and/or another component that can provide the foregoing functions. In a simple embodiment, persons skilled in the art may figure out that the encoding apparatus and the decoding apparatus may be in the form shown in FIG. 11.

For example, the processor 1101 in FIG. 11 may invoke the computer-executable instructions stored in the memory 1102, so that the encoding apparatus performs the encoding method performed by the PMA layer in the method embodiment corresponding to FIG. 3. The processor 1101 in FIG. 11 may invoke the computer-executable instructions stored in the memory 1102, so that the decoding apparatus performs the decoding method performed by the PMA layer in the method embodiment corresponding to FIG. 9.

Specifically, functions/implementation processes of the first processing unit 1202 in FIG. 12 and the second processing unit 1302 in FIG. 13 may be implemented by the processor 1101 in FIG. 11 invoking the computer-executable instructions stored in the memory 1102. Functions/implementation processes of the first obtaining unit 1201 in FIG. 12 and the second obtaining unit 1301 in FIG. 13 may be implemented by using the transceiver 1103 in FIG. 11.

In the device in FIG. 11 in this application, a communication connection is implemented between the components. To be specific, the processing unit (or the processor), the storage unit (or the memory), and the transceiver unit (the transceiver) communicate with each other through an internal connection path, to transfer a control signal and/or a data signal. The foregoing method embodiments of this application may be applied to a processor, or the steps in the foregoing method embodiments are implemented by a processor. The processor may be an integrated circuit chip with a signal processing capability. In an implementation process, the steps in the foregoing method embodiments can be completed by using an integrated logic circuit of hardware in the processor, or by using instructions in a form of software. The processor may be a central processing unit (CPU), a network processor (NP), a combination of the CPU and the NP, a digital signal processor (DSP), an application-specific integrated circuit (ASIC), a field programmable gate array (FPGA) or another programmable logic device, a discrete gate or a transistor logic device, or a discrete hardware component. The processor may implement or perform the methods, steps, and logical block diagrams disclosed in this application. The general-purpose processor may be a microprocessor, or the processor may be any conventional processor or the like. Steps of the methods disclosed with reference to this application may be directly executed and accomplished by using a hardware decoding processor, or may be executed and accomplished by using a combination of hardware in a decoding processor and a software module. The software module may be located in a mature storage medium in the art, such as a random access memory, a flash, a read-only memory, a programmable read-only memory, an electrically erasable programmable memory, or a register. The storage medium is located in the memory, and the processor reads information in the memory and completes the steps in the foregoing methods in combination with hardware of the processor. Although only one processor is shown in the figure, the apparatus may include a plurality of processors, or the processor includes a plurality of processing units. Specifically, the processor may be a single-core (single-CPU) processor, or may be a multi-core (multi-CPU) processor.

The memory is configured to store computer instructions executed by the processor. The memory may be a storage circuit, or may be a memory. The memory may be a volatile memory or a nonvolatile memory, or may include the volatile memory and the nonvolatile memory. The nonvolatile memory may be a read-only memory, a programmable read-only memory, an erasable programmable read-only memory, an electrically erasable programmable read-only memory, or a flash. The volatile memory may be a random access memory, and may serve as an external cache. The memory may be independent of the processor, or may be a storage unit in the processor. This is not limited herein. Although only one memory is shown in the figure, the apparatus may include a plurality of memories, or the memory includes a plurality of storage units.

The transceiver is configured to implement content exchange between the processor and another unit or network element. Specifically, the transceiver may be a communication interface of the apparatus, may be a transceiver circuit or a communication unit, or may be a transceiver. Alternatively, the transceiver may be a communication interface of the processor or a transceiver circuit. Optionally, the transceiver may be a transceiver chip. The transceiver may alternatively include a sending unit and/or a receiving unit. In a possible implementation, the transceiver may include at least one communication interface. In another possible implementation, the transceiver may alternatively be a unit implemented in a form of software. In embodiments of this application, the processor may interact with the another unit or network element by using the transceiver. For example, the processor obtains or receives content from the another network element by using the transceiver. If the processor and the transceiver are two physically separated components, the processor may exchange content with the another unit of the apparatus without using the transceiver.

In a possible implementation, the processor, the memory, and the transceiver may be connected to each other through a bus. The bus may be a peripheral component interconnect (PCI) bus, an extended industry standard architecture (EISA) bus, or the like. Buses may be classified into an address bus, a data bus, a control bus, and the like.

In embodiments of this application, words such as "example" or "for example" are for representing giving an example, an illustration, or a description. Any embodiment or design scheme described as "example" or "for example" in embodiments of this application should not be explained as being more preferred or having more advantages than another embodiment or design scheme. Exactly, use of the word such as "example" or "for example" is intended to present a relative concept in a specific manner.

In embodiments of this application, for ease of understanding, a plurality of examples are used for description. However, these examples are merely examples, but do not mean optimal implementations of implementing this application.

All or some of the foregoing embodiments may be implemented by using software, hardware, firmware, or any combination thereof. When the software is used for implementation, all or some of embodiments may be implemented in a form of a computer program product.

The computer program product includes one or more computer instructions. When the computer-executable instructions are loaded and executed on a computer, the procedure or functions according to embodiments of this application are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, DVD), a semiconductor medium (for example, a solid-state drive (SSD)), or the like.

It may be clearly understood by persons skilled in the art that for the purpose of convenient and brief description, for a detailed working process of the transmitting-end optical module, the receiving-end optical module, the units, and the modules, refer to a corresponding process in the foregoing method embodiments. Details are not described herein again.

The foregoing embodiments are merely for describing the technical solutions in this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof. However, these modifications or replacements do not make the essence of the corresponding technical solutions depart from the spirit and the scope of the technical solutions in embodiments of this application.

42

What is claimed is:

1. A method, comprising:
obtaining m lanes of first data streams through m input lanes, wherein m is a positive integer;
processing the m lanes of first data streams to obtain z lanes of second data streams, wherein z is a positive integer;
separately performing encoding processing on each of the z lanes of second data streams, to obtain z lanes of third data streams, wherein m=4 and z=32; and
performing multiplexing processing on the z lanes of third data streams, to obtain n lanes of fourth data streams, wherein n=4.

2. The method according to claim 1, wherein each of the z lanes of second data streams comprises a to-be-encoded data block, and separately performing encoding processing on each of the z lanes of second data streams comprises:
for each of the z lanes of second data streams, performing encoding processing on a first data block to obtain one or more forward error correction (FEC) codewords, wherein each first data block is at least C/z consecutive to-be-encoded data blocks in the corresponding second data stream, C is a positive integer, and C is an integer multiple of z; and
wherein the method further comprises:
for each of the z lanes of second data streams, inserting a first identifier at a position of a codeword boundary of one of the FEC codewords of the corresponding lane of second data streams.

3. The method according to claim 2, wherein each first identifier comprises a preset identifier sequence.

4. The method according to claim 2, wherein a throughput or a baud rate of data obtained through insertion of the corresponding first identifier is an integer multiple of a reference clock.

5. The method according to claim 1, wherein processing the m lanes of first data streams to obtain the z lanes of second data streams comprises:
performing demultiplexing processing on the m lanes of first data streams based on a second ratio, to obtain the z lanes of second data streams, wherein the second ratio is a ratio of m to z.

6. The method according to claim 5, wherein performing the demultiplexing processing on the m lanes of first data streams based on the second ratio, to obtain the z lanes of second data streams, comprises:
performing demultiplexing processing on the m lanes of first data streams based on the second ratio, to obtain z lanes of fifth data streams; and
separately performing Q-stage processing on each of the z lanes of fifth data streams to obtain the z lanes of second data streams, wherein Q=1, and wherein each stage of processing in the Q-stage processing comprises:
performing round-robin distribution processing on each of the z lanes of fifth data streams, to obtain at least two lanes of data substreams;
performing delay processing on a first data substream to obtain a sixth data stream; and
performing multiplexing processing on a second data substream and the sixth data stream to obtain an output data stream; and
wherein the first data substream is at least one of the at least two lanes of data substreams, and the second data substream is one lane of data substream that is in the at least two lanes of data substreams and on which delay processing is not performed, and wherein the output data stream is a second data stream.

7. The method according to claim 1, further comprising:

identifying an alignment marker in each lane of second data stream of the z lanes of second data streams, wherein the alignment marker identifies a symbol boundary in the corresponding second data stream.

8. The method according to claim 7, wherein each alignment marker comprises an alignment block of 120 bits, and each alignment block comprises a 48-bit common alignment marker.

9. The method according to claim 1, wherein the m lanes of first data streams are obtained by performing, at a first ratio, multiplexing processing on z lanes of data streams obtained through Reed-Solomon (RS) encoding.

10. The method according to claim 1, wherein before performing encoding processing on each of the z lanes of second data streams, to obtain the z lanes of third data streams, the method further comprises:

performing delay processing on each of the z lanes of second data streams; and performing multiplexing processing on a data substream on which delay processing is not performed and a data substream on which delay processing is not performed.

11. An apparatus, comprising:

a transmitter; and one or more processors, configured to:

obtain m lanes of first data streams through m input lanes, wherein m is a positive integer;

process the m lanes of first data streams, to obtain z lanes of second data streams, wherein z is a positive integer;

separately perform encoding processing on each of the z lanes of second data streams, to obtain z lanes of third data streams, wherein m=4 and z=32; and perform multiplexing processing on the z lanes of third data streams, to obtain n lanes of fourth data streams, wherein n=4.

12. The apparatus according to claim 11, wherein each of the z lanes of second data streams comprises a to-be-encoded data block, and the one or more processors are configured to:

for each of the z lanes of second data streams, perform encoding processing on a first data block to obtain one or more forward error correction (FEC) codewords, wherein each first data block is at least C/z consecutive to-be-encoded data blocks in the corresponding second data stream, C is a positive integer, and C is an integer multiple of z; and for each of the Z lanes of second data streams, insert a first identifier at a position of a codeword boundary of any one of the FEC codewords of the corresponding lane of second data streams.

13. The apparatus according to claim 12, wherein a throughput or a baud rate of data obtained through insertion of the corresponding first identifier is an integer multiple of a reference clock.

14. The apparatus according to claim 11, wherein the one or more processors are configured to:

perform demultiplexing processing on the m lanes of first data streams based on a second ratio, to obtain the z lanes of second data streams, wherein the second ratio is a ratio of m to z.

15. The apparatus according to claim 14, wherein the one or more processors are configured to:

perform demultiplexing processing on the m lanes of first data streams based on the second ratio, to obtain z lanes of fifth data streams; and separately perform Q-stage processing on each of the z lanes of fifth data streams to obtain the z lanes of second data streams, wherein Q=1, and wherein each stage of processing in the Q-stage processing comprises:

performing round-robin distribution processing on each of the z lanes of fifth data streams, to obtain at least two lanes of data substreams;

performing delay processing on a first data substream to obtain a sixth data stream; and performing multiplexing processing on a second data substream and the sixth data stream to obtain an output data stream; and wherein the first data substream is at least one of the at least two lanes of data substreams, and the second data substream is one lane of data substream that is in the at least two lanes of data substreams and on which delay processing is not performed, and wherein the output data stream is a second data stream.

16. The apparatus according to claim 11, wherein the one or more processors are configured to:

before performing encoding processing on each of the z lanes of second data streams, to obtain z lanes of third data streams, perform delay processing on each of the z lanes of second data streams; and perform multiplex processing on a data substream on which delay processing is not performed and a data substream on which delay processing is not performed.

17. A method, comprising:

obtaining m lanes of first data streams through m input lanes, wherein m is a positive integer;

performing demultiplexing processing on the m lanes of first data streams based on a second ratio, to obtain z lanes of fifth data streams, wherein z is a positive integer;

separately performing Q-stage processing on each of the z lanes of fifth data streams to obtain z lanes of second data streams, wherein Q=1, and wherein each stage of processing in the Q-stage processing comprises:

performing round-robin distribution processing on each of the z lanes of fifth data streams, to obtain at least two lanes of data substreams;

performing delay processing on a first data substream to obtain a sixth data stream; and performing multiplexing processing on a second data substream and the sixth data stream to obtain an output data stream, wherein the first data substream is at least one of the at least two lanes of data substreams, and the second data substream is one lane of data substream that is in the at least two lanes of data substreams and on which delay processing is not performed, and wherein the output data stream is a second data stream;

separately performing encoding processing on each of the z lanes of second data streams, to obtain z lanes of third data streams; and performing multiplexing processing on the z lanes of third data streams, to obtain n lanes of fourth data streams, wherein n is a positive integer.

US 12,633,945 B2

45

18. An apparatus, comprising:
a transmitter; and
one or more processors, configured to:
    obtain m lanes of first data streams through m input lanes, wherein m is a positive integer;
    perform demultiplexing processing on the m lanes of first data streams based on a second ratio, to obtain z lanes of fifth data streams, wherein z is a positive integer;
    separately perform Q-stage processing on each of the z lanes of fifth data streams to obtain z lanes of second data streams, wherein Q=1, and wherein each stage of processing in the Q-stage processing comprises:
        performing round-robin distribution processing on each of the z lanes of fifth data streams, to obtain at least two lanes of data substreams;
        performing delay processing on a first data substream to obtain a sixth data stream; and

performing multiplexing processing on a second data substream and the sixth data stream to obtain an output data stream, and wherein the first data substream is at least one of the at least two lanes of data substreams, the second data substream is one lane of data substream that is in the at least two lanes of data substreams and on which delay processing is not performed, wherein the output data stream is a second data stream;
separately perform encoding processing on each of the z lanes of second data streams, to obtain z lanes of third data streams; and
perform multiplexing processing on the z lanes of third data streams, to obtain n lanes of fourth data streams, wherein n is a positive integer.

* * * * *